(12) United States Patent
Sonoda et al.

(10) Patent No.: US 12,114,522 B2
(45) Date of Patent: Oct. 8, 2024

(54) DISPLAY DEVICE AND METHOD THAT PREVENT FOREIGN SUBSTANCE GENERATION AT A DAM WALL RESULTING IN HIGHER QUALITY OF DISPLAY FOR MANUFACTURING SAME

(71) Applicant: SHARP KABUSHIKI KAISHA, Osaka (JP)

(72) Inventors: Tohru Sonoda, Osaka (JP); Takashi Ochi, Osaka (JP); Jumpei Takahashi, Osaka (JP); Tohru Senoo, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 771 days.

(21) Appl. No.: 17/280,840

(22) PCT Filed: Sep. 28, 2018

(86) PCT No.: PCT/JP2018/036437
§ 371 (c)(1),
(2) Date: Mar. 26, 2021

(87) PCT Pub. No.: WO2020/065955
PCT Pub. Date: Apr. 2, 2020

(65) Prior Publication Data
US 2022/0006050 A1    Jan. 6, 2022

(51) Int. Cl.
*H10K 50/844*    (2023.01)
*H10K 50/84*    (2023.01)
*H10K 59/131*    (2023.01)
*H10K 59/12*    (2023.01)

(52) U.S. Cl.
CPC ......... *H10K 50/844* (2023.02); *H10K 50/841* (2023.02); *H10K 59/131* (2023.02); *H10K 59/1201* (2023.02)

(58) Field of Classification Search
CPC ... H10K 50/844; H10K 50/841; H10K 59/131
USPC ........................................................ 257/40
See application file for complete search history.

(56) References Cited

U.S. PATENT DOCUMENTS

| | | |
|---|---|---|
| RE42,215 E | 3/2011 | Kobayashi et al. |
| RE43,738 E | 10/2012 | Kobayashi et al. |
| RE44,902 E | 5/2014 | Kobayashi et al. |
| RE45,556 E | 6/2015 | Kobayashi et al. |
| RE47,817 E | 1/2020 | Kobayashi et al. |
| 2003/0168966 A1 | 9/2003 | Kobayashi et al. |

(Continued)

FOREIGN PATENT DOCUMENTS

| | | |
|---|---|---|
| CN | 106711171 A | 5/2017 |
| CN | 107291303 A | 10/2017 |

(Continued)

*Primary Examiner* — Quoc D Hoang
(74) *Attorney, Agent, or Firm* — ScienBiziP, P.C.

(57) ABSTRACT

In an organic EL display device in which an outer peripheral shape of a display region is a variant shape different from a rectangular shape and having rounded corner portions and a notch portion, a protruding portion having a height equal to or greater than heights of a first dam wall and a second dam wall is provided at positions facing the rounded corner portions and the notch portion in the display region through the second dam wall and the first dam wall positioned inside the second dam wall, on the outer side of the second dam wall in a frame region.

20 Claims, 16 Drawing Sheets

(56) References Cited

U.S. PATENT DOCUMENTS

| | | | |
|---|---|---|---|
| 2005/0112408 | A1 | 5/2005 | Kobayashi et al. |
| 2015/0091030 | A1 | 4/2015 | Lee et al. |
| 2016/0111040 | A1 | 4/2016 | Kim et al. |
| 2016/0172429 | A1 | 6/2016 | Kondoh et al. |
| 2017/0141352 | A1 | 5/2017 | Shin |
| 2017/0207418 | A1* | 7/2017 | Shin ................... H10K 59/131 |
| 2018/0040857 | A1 | 2/2018 | Hong et al. |
| 2018/0183004 | A1 | 6/2018 | Shin |
| 2019/0206958 | A1* | 7/2019 | Lee ...................... H10K 59/123 |
| 2019/0280243 | A1 | 9/2019 | Shin |
| 2020/0274099 | A1 | 8/2020 | Shin |
| 2021/0020874 | A1 | 1/2021 | Hong et al. |
| 2021/0234127 | A1 | 7/2021 | Shin |

FOREIGN PATENT DOCUMENTS

| | | |
|---|---|---|
| JP | 2011-175300 A | 9/2011 |
| JP | 2016-114805 A | 6/2016 |
| JP | 2018-026344 A | 2/2018 |
| WO | 2014/041614 A1 | 3/2014 |
| WO | 2017/127563 A1 | 7/2017 |

\* cited by examiner

DISPLAY DEVICE AND METHOD THAT PREVENT FOREIGN SUBSTANCE GENERATION AT A DAM WALL RESULTING IN HIGHER QUALITY OF DISPLAY FOR MANUFACTURING SAME

TECHNICAL FIELD

The present disclosure relates to a display device and a method of manufacturing the same.

BACKGROUND ART

In recent years, a self-luminous type organic electroluminescence (EL) display device using organic EL elements has attracted attention as a display device to replace liquid crystal display devices.

An organic EL display device is provided with a sealing film that covers an organic EL element to inhibit deterioration of the organic EL element due to infiltration of moisture, oxygen, or the like. As a sealing structure based on a sealing film, a structure in which the sealing film is composed of a layered film including an organic layer and an inorganic layer has been proposed (see, for example, PTL 1). The organic layer constituting the sealing film is formed by, for example, an ink-jet method.

Furthermore, in an organic EL display device, the design properties of a display device are improved by configuring a display region, the planar shape of which is a variant shape different from a rectangular shape. For example, the display region of an organic EL display device may have a substantially rectangular shape in which four corners are formed as rounded corner portions having a curved shape. As a method of manufacturing such an organic EL display device, a method of devising a configuration of a film forming mask used to form an organic EL element has been proposed.

The film forming mask includes a mask frame having a rectangular frame shape, a plurality of mask sheets having two end portions fixed and stretched over the mask frame, and a plurality of supporting sheets that support the plurality of mask sheets. The mask sheet is formed in a strip shape and includes a vapor deposition pattern opening including a plurality of through-holes for performing vapor deposition on a multi-chamfering mother substrate in units of pixels or subpixels. The supporting sheet is formed in a narrow plate shape extending linearly, and two end portions thereof are fixed to be stretched over the mask frame in a direction orthogonal to the mask sheet. In addition, the supporting sheet is provided with a shielding portion that shields a region on which deposition is performed through the vapor deposition pattern opening formed in the mask sheet such that it has a shape in which rectangular corners are partially omitted in units of display panels (see, for example, PTL 2). Furthermore, the film forming mask is provided with a cover sheet. The cover sheet is formed in a narrow plate shape extending linearly, and two end portions of the cover sheet are fixed and stretched over the mask frame in a direction parallel to the mask sheet. The cover sheet is provided between the mask sheets. Such a film forming mask is disposed in a vapor deposition apparatus and is used in a state where the mask is drawn to the mother substrate side due to a magnetic force.

CITATION LIST

Patent Literature

PTL 1: JP 2011-175300 A
PTL 2: JP 2018-026344 A

SUMMARY

Technical Problem

In the manufacture of an organic EL display device, in a case where the above-described film forming mask is used, a supporting sheet and a cover sheet are displaced toward a mother substrate side due to the film forming mask being drawn to a mother substrate side in a vapor deposition apparatus due to a magnetic force, and a mask sheet is strongly pressed against the mother substrate side due to the displacement. At this time, since the mask sheet is in contact with a dam wall in a region where a shielding portion is provided, a pressing force of the mask sheet against the dam wall is increased, and thus the dam wall wears, and foreign substances are easily generated in the dam wall and around the dam wall. When such foreign substances are generated, a conductive portion and various wiring lines for allowing electrical conduction with an electrode of an organic EL element are provided at the corresponding location of the dam wall and on a display region side thereof, and thus there is a concern that the quality of display of the organic EL display device may be adversely affected.

The technique of the present disclosure is contrived in view of such circumstances, and an object thereof is to prevent foreign substances from being generated at the corresponding location of a dam wall and on a display region side thereof in an organic EL display device including a display region having a variant shape.

Solution to Problem

A display device according to the technology of the present disclosure includes a base substrate, a TFT layer provided on the base substrate, a light-emitting element provided on the TFT layer, and a sealing film provided to cover the light-emitting element, in which a display region for displaying an image by light emission of the light-emitting element and a frame region positioned around the display region are provided, the frame region is provided with a dam wall surrounding the display region, and the sealing film includes an organic layer provided on an inner side of the dam wall, the display region is provided in a variant shape including a variant portion, an outer peripheral shape of the variant portion being different from a rectangular shape, and a protruding portion having a height equal to or greater than that of the dam wall is provided at a position facing the variant portion in the display region via the dam wall on an outer side of the dam wall in the frame region.

Advantageous Effects of Disclosure

According to the display device described above, the protruding portion facing a variant portion in a display region is provided on an outer side of a dam wall in a frame region at a height equal to or greater than the dam wall. Thus, in the manufacture of the display device, even when a film forming mask provided with a shielding portion for forming the variant portion in the display region is used, the film forming mask comes into contact with the protruding portion with preference over the dam wall. As a result, even when the film forming mask is prevented from coming into contact with the dam wall or comes into contact with the dam wall, a load applied to the dam wall is dispersed due to pressing of the film forming mask, and thus it is possible to inhibit generation of foreign substances at the corresponding location of the dam wall and on the display region side.

DESCRIPTION OF EMBODIMENTS

Hereinafter, exemplary embodiments will be described in detail with reference to the drawings. Note that, in the following embodiments, a case where a component such as a certain film or layer is provided or formed on a component such as another film or layer includes not only a case where a certain component is present directly on top of another component, but also a case where a component such as another film or layer is interposed between both the components.

First Embodiment

Configuration of Organic EL Display Device

Figure 1:
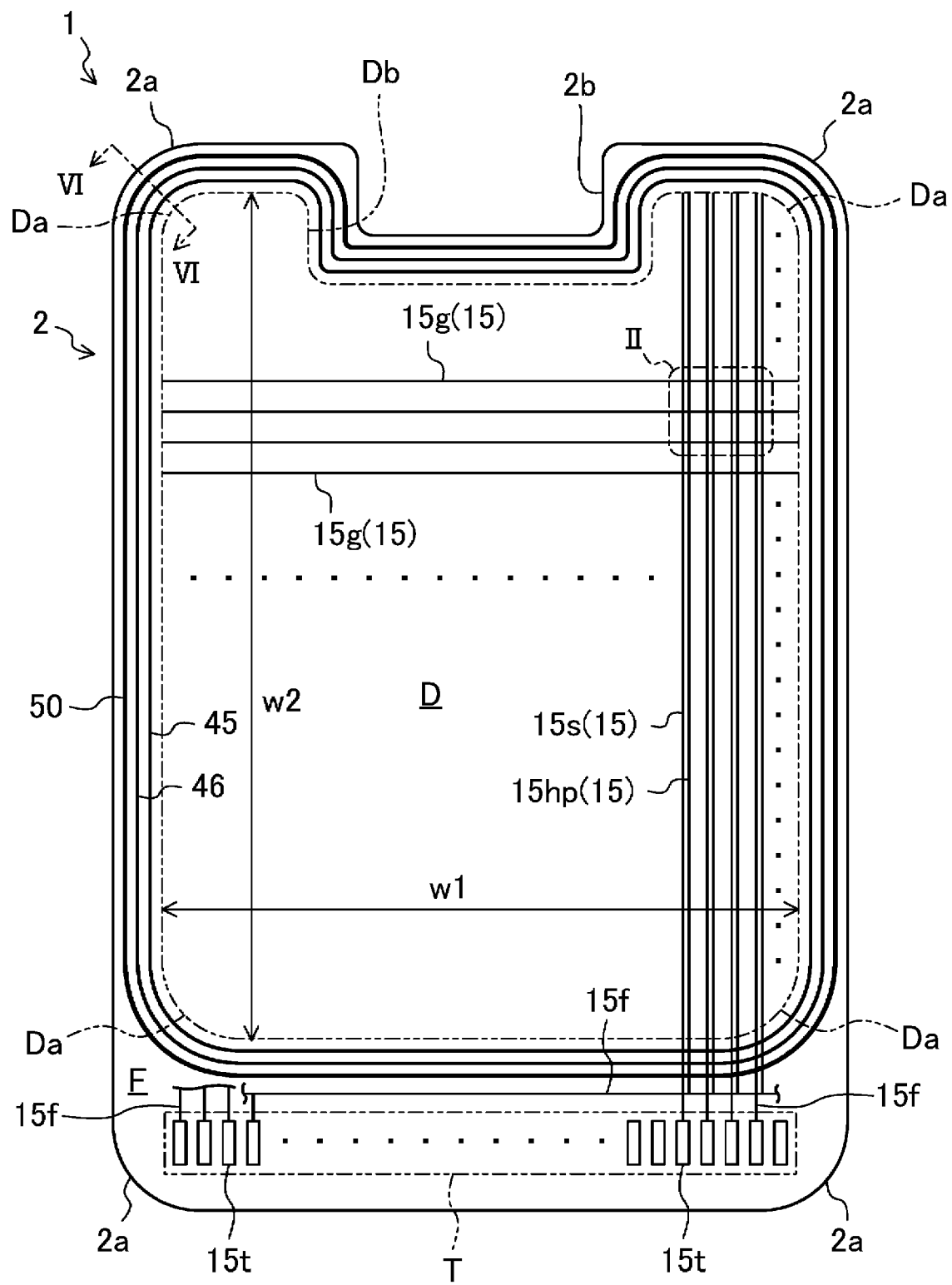
FIG. 1 is a plan view illustrating a schematic configuration of a display panel constituting an organic EL display device according to a first embodiment.
Figure 2:
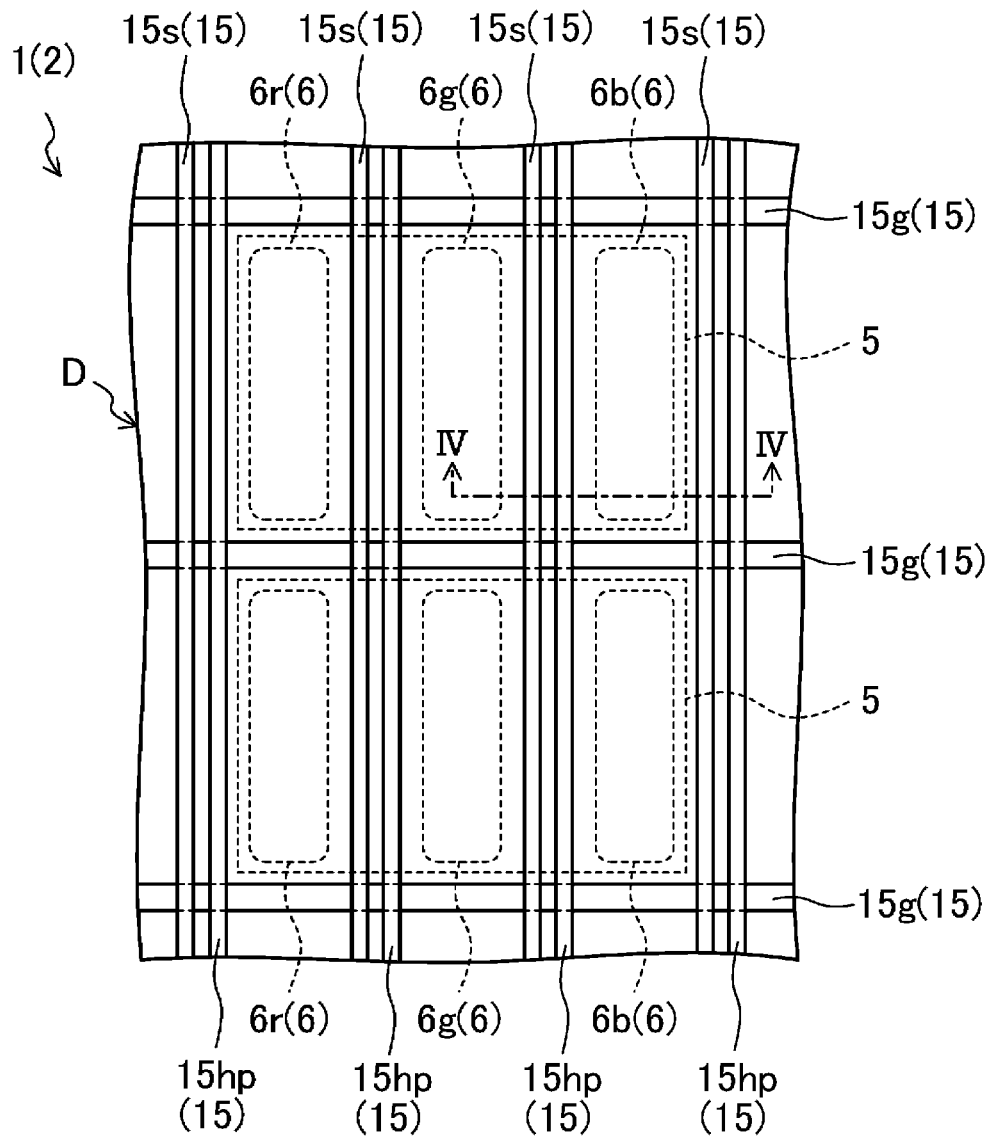
FIG. 2 is a plan view illustrating a portion of a display region surrounded by II illustrated in FIG. 1.
Figure 3:
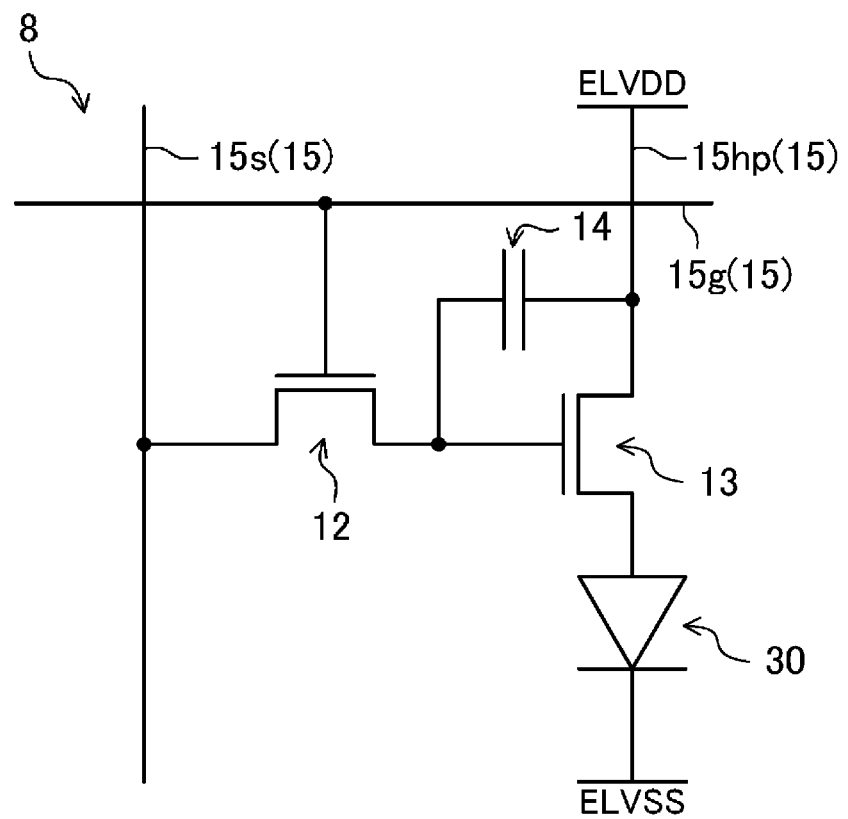
FIG. 3 is an equivalent circuit diagram of a portion of a TFT layer constituting the organic EL display device according to the first embodiment.
Figure 4:
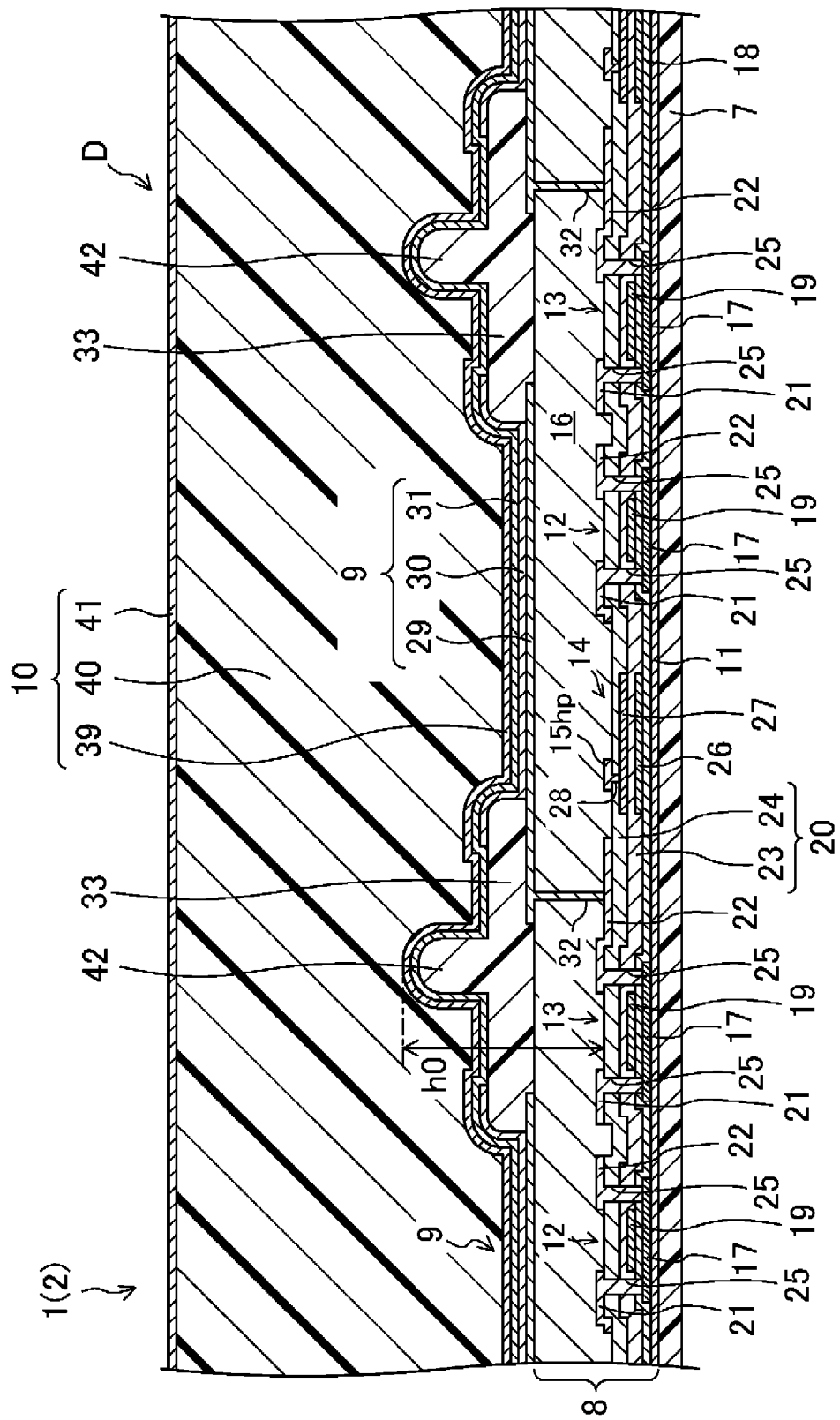
FIG. 4 is a cross-sectional view taken along line IV-IV of the display region of FIG. 2.
Figure 5:
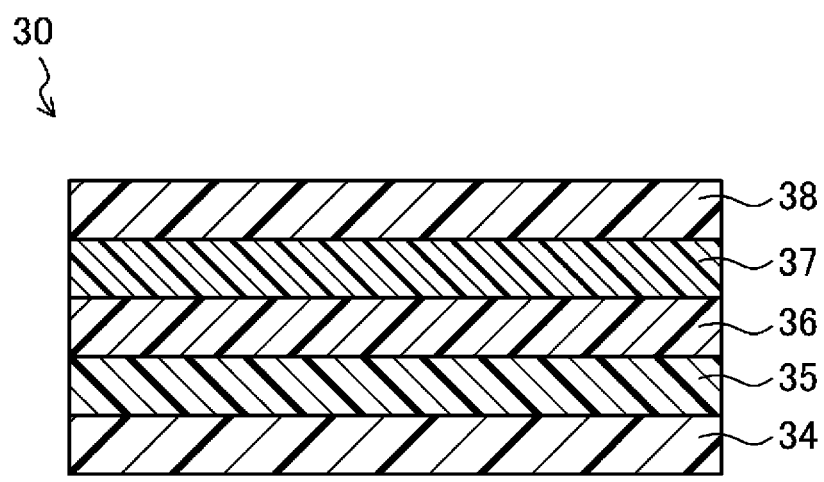
FIG. 5 is a cross-sectional view illustrating a layered structure of an organic EL layer constituting the organic EL display device according to the first embodiment.

FIG. 1 is a plan view illustrating a schematic configuration of a display panel 2 constituting an organic EL display device 1 according to a first embodiment. FIG. 2 is a plan view illustrating a portion of a display region D surrounded by II illustrated in FIG. 1. FIG. 3 is an equivalent circuit diagram of a portion of a TFT layer 8 constituting the organic EL display device 1. FIG. 4 is a cross-sectional view taken along line IV-IV of the display region D in FIG. 2. FIG. 5 is a cross-sectional view illustrating a layered structure of an organic EL layer 30 constituting the organic EL display device 1.

As illustrated in FIG. 1, the organic EL display device 1 includes the display panel 2 having a contour having a variant shape different from a rectangular shape when seen in a plan view. The display panel 2 is configured such that four corners are formed as rounded corner portions 2a having a curved shape (R shape) and includes a notch portion 2b having a recessed shape in an intermediate portion of one side. In the present specification, a shape other than a rectangular shape may be referred to as a "variant" below. The display panel 2 includes the display region D for displaying an image and a frame region F positioned around the display region D. In addition, a terminal portion T for connection to an external circuit is provided in the frame region F. Although not illustrated in the drawing, a wiring line substrate such as a flexible printed circuit (FPC) is connected to the terminal portion T.

The display region D is provided to have a variant shape conforming to the contour of the display panel 2 and includes rounded corner portions Da at four corners and a notch portion Db provided in one side. The rounded corner portions Da and the notch portion Db are an example of a variant portion in which the outer peripheral shape of the display region D has a shape different from a rectangular shape. The notch portion Db constitutes, for example, a location for accommodating a mounting part such as a camera. The frame region F is provided to have a frame shape having a plurality of sides along the outer peripheral shape of the display region D. The terminal portion T is provided in a portion of the frame region F which constitutes one side facing the notch portion Db.

Although not illustrated in the drawing, a control circuit such as a gate driver; and a conductive portion or a wiring line for allowing electrical conduction to an organic EL element 9 (second electrode 31) are provided in a portion of the frame region F which constitutes a side (right and left sides of FIG. 1) adjacent to a side where the terminal portion T is provided. Additionally, a plurality of lead wiring lines 15f are provided between the display region D and the terminal portion T in the frame region F. A low voltage power source wiring line is included in the plurality of lead wiring lines 15f. In the terminal portion T, wiring line terminals 15t for allowing electrical conduction to the lead wiring lines 15f are aligned in a predetermined pattern.

The display panel 2 adopts an active matrix driving method. As illustrated in FIG. 2, the display region D is composed of a plurality of pixels 5. The plurality of pixels 5 are disposed in a matrix shape. For example, each of the pixels 5 includes subpixels 6 of three colors composed of a subpixel 6r for displaying a red color, a subpixel 6g for displaying a green color, and a subpixel 6b for displaying a blue color. For example, the subpixels 6r, 6g, and 6b of three colors are aligned in juxtaposition and adjacent to each other in a stripe shape.

As illustrated in FIG. 4, the display panel 2 includes a resin substrate layer 7, the thin film transistor (TFT) layer 8 provided on the resin substrate layer 7, the organic EL element 9 provided on the TFT layer 8, and a sealing film 10 provided to cover the organic EL element 9.

Resin Substrate Layer

The resin substrate layer 7 is formed of, for example, a polyimide resin or the like and has flexibility. The resin substrate layer 7 is an example of a base substrate.

TFT Layer

The TFT layer 8 includes a base coat film 11 provided on the resin substrate layer 7; a plurality of first TFTs 12, a plurality of second TFTs 13, a plurality of capacitors 14, and various display wiring lines 15 which are provided on the base coat film 11; and a flattening film 16 provided to cover the first TFTs 12, the second TFTs 13, the capacitors 14, and the display wiring lines 15.

The base coat film 11 is composed of a single-layer film or a layered film of an inorganic insulating film formed of, for example, silicon oxide (SiOx), silicon nitride (SiNx), silicon oxynitride (SiOxNy; x>y), or silicon nitride oxide (SiNxOy; x>y) (x and y are positive numbers, the same applies hereinafter). The first TFT 12, the second TFT 13, and the capacitor 14 are provided for each subpixel 6.

As illustrated in FIG. 2 and FIG. 3, as the display wiring lines 15, a plurality of gate wiring lines 15g for transmitting a gate signal, a plurality of source wiring lines 15s for transmitting a source signal, and a plurality of high voltage power source wiring lines 15hp for supplying a current to the organic EL element 9 are provided. The plurality of gate wiring lines 15g extend parallel to each other in a direction along a side where the terminal portion T is provided. The plurality of source wiring lines 15s extend parallel to each other in a direction intersecting the gate wiring lines 15g. The plurality of high voltage power source wiring lines 15hp extend parallel to each other along the source wiring lines 15s.

The gate wiring lines 15g, the source wiring lines 15s, and the high voltage power source wiring lines 15hp are insulated from each other and are formed in a lattice pattern as a whole to define each of the subpixels 6. The gate wiring lines 15g are connected to a gate driver provided in the frame region F and are sequentially driven (receive signals applied thereto) by the gate driver. The source wiring lines 15s and the high voltage power source wiring lines 15hp are drawn out from the display region D to the terminal portion T as the lead wiring lines 15f. The high voltage power source wiring lines 15hp are electrically connected to a high voltage power source (ELVDD) through the wiring line terminals 15t provided in the terminal portion T.

The first TFT 12 and the second TFT 13 are examples of an active element and adopt, for example, a top gate type structure. Specifically, as illustrated in FIG. 4, each of the first TFT 12 and the second TFT 13 includes a semiconductor layer 17 provided in an island shape on the base coat film 11, a gate insulating film 18 provided to cover the semiconductor layer 17, a gate electrode 19 overlapping a portion (channel region) of the semiconductor layer 17 through the gate insulating film 18, an interlayer insulating film 20 provided to cover the gate electrode 19, and a source electrode 21 and a drain electrode 22 that are provided on the interlayer insulating film 20.

The gate electrode 19 is formed of the same material in the same layer as the plurality of gate wiring lines 15g. The interlayer insulating film 20 is composed of a layered film including a first interlayer insulating film 23 and a second interlayer insulating film 24. Each of the first interlayer insulating film 23, the second interlayer insulating film 24, and the gate insulating film 18 is composed of a single-layer film or a layered film of an inorganic insulating layer formed of, for example, silicon oxide (SiOx). silicon nitride (SiNx), silicon oxynitride (SiOxNy; x>y), or silicon nitride oxide (SiNxOy; x>y).

The source electrode 21 and the drain electrode 22 are separated from each other and are respectively connected to different portions (the source region and the drain region) at positions with a region (channel region) overlapping the gate electrode 19 in the semiconductor layer 17 therebetween, through contact holes 25 formed in the gate insulating film 18 and the interlayer insulating film 20. The source electrode 21 is formed of the same material in the same layer as the plurality of source wiring lines 15s.

In the first TFT 12, the gate electrode 19 is provided integrally with the corresponding gate wiring line 15g, the source electrode 21 is provided integrally with the corresponding source wiring line 15s, and the drain electrode 22 is electrically connected to the gate electrode 19 of the second TFT 13 and the capacitor 14. In the second TFT 13, the source electrode 21 is electrically connected to the high voltage power source wiring line 15hp, and the drain electrode 22 is electrically connected to the organic EL element 9 (a first electrode 29).

The capacitor 14 is connected to the corresponding first TFT 12 and the corresponding high voltage power source wiring line 15hp. The capacitor 14 includes a lower conductive layer 26 provided on the gate insulating film 18, the first interlayer insulating film 23 provided to cover the lower conductive layer 26, and an upper conductive layer 27 overlapping the lower conductive layer 26 through the first interlayer insulating film 23. The lower conductive layer 26 is formed of the same material in the same layer as the gate electrode 19. The upper conductive layer 27 is connected to the high voltage power source wiring line 15hp through a contact hole 28 formed in the second interlayer insulating film 24.

In the display region D, the flattening film 16 covers portions except for a portion of the drain electrode 22 of the second TFT 12 to flatten the surface of the TFT layer 8 so that the surface shapes of the source wiring line 15s, the high voltage power source wiring lines 15hp, the first TFTs 12, and the second TFTs 13 are not reflected. The flattening film 16 is formed of an organic material such as a photoconductive polyimide resin.

Organic EL Element

The organic EL element 9 is provided on the flattening film 16 and constitutes the display region D. The organic EL element 9 is an example of a light-emitting element and adopts a top emission type structure. Specifically, the organic EL element 9 includes the plurality of first electrodes 29 provided in the surface of the flattening film 16, the organic EL layer 30 being a functional layer provided on the first electrodes 29, and the second electrode 31 overlapping the first electrodes 29 through the organic EL layer 30.

The first electrodes 29 are provided in each of the subpixels 6 and disposed in a matrix shape. The first electrode 29 is connected to the drain electrode 22 of the second TFT 13 in the corresponding subpixel 6 through a contact hole 32 formed in the flattening film 16. These first electrodes 29 are an example of pixel electrodes. The first electrode 29 has a function of injecting holes into the organic EL layer 30 and is preferably formed of a material having a large work function to improve the efficiency of hole injection into the organic EL layer 30.

Examples of a material of the first electrode 29 include a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and the like.

Additionally, a material of the first electrode 29 may be, for example, an alloy of magnesium (Mg)-copper (Cu), an alloy of magnesium (Mg)-silver (Ag), an alloy of sodium (Na)-potassium (K), an alloy of astatine (At)-astatine oxide ($AtO_2$), an alloy of lithium (Li)-aluminum (Al), an alloy of lithium (Li)-calcium (Ca)-aluminum (Al), or the like.

Additionally, the material of the first electrode 29 may be a conductive oxide such as tin oxide (SnO), zinc oxide (ZnO), indium tin oxide (ITO), or indium zinc oxide (IZO). Additionally, the first electrode 29 may be formed by layering a plurality of layers including the materials described above. Note that examples of the material having a large work function include indium tin oxide (ITO) and indium zinc oxide (IZO).

The first electrodes 29 of the adjacent subpixels 6 are defined by an edge cover 33 provided on the flattening film 16. The edge cover 33 is formed in a lattice pattern and covers a peripheral end portion of each of the first electrodes 29. Examples of the material of the edge cover 33 include inorganic compounds such as silicon oxide, silicon nitride, silicon oxynitride, and the like; and organic materials such as a polyimide resin, an acrylic resin, a polysiloxane resin, a novolak resin, and the like.

A photospacer 42 having a convex shape is integrally provided in the central portion of the edge cover 33. In the manufacturing process for the organic EL display device 1, the photospacer 42 functions as a stopper with respect to the film forming mask used at the time of forming a vapor deposition film or the like. The photospacer 42 is formed by making a portion corresponding to a photospacer 33a in the edge cover 33 to be thicker than other portions by using a gray tone mask or a halftone mask.

The organic EL layer 30 is provided for each subpixel 6. As illustrated in FIG. 5, the organic EL layer 30 has a structure in which a hole injection layer 34, a hole transport layer 35, a light-emitting layer 36, an electron transport layer 37, and an electron injection layer 38 are layered in this order on the first electrode 29. The hole injection layer 34, the hole transport layer 35, the light-emitting layer 36, the electron transport layer 37, and the electron injection layer 38 are thin film patterns formed using a film forming mask 70 and are vapor deposition films formed by, for example, a vacuum vapor deposition technique.

The hole injection layer 34 is also referred to as an anode buffer layer and has a function of improving the efficiency of hole injection from the first electrode 29 into the organic EL layer 30 by bringing energy levels of the first electrode 29 and the organic EL layer 30 close to each other. Examples of a material of the hole injection layer 34 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and the like.

The hole transport layer 35 has a function of efficiently making a hole move to the light-emitting layer 36. Examples of a material of the hole transport layer 35 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted alcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide, and the like.

The light-emitting layer 36 has a function of recombining a hole injected from the first electrode 29 and an electron injected from the second electrode 31 and emitting light when a voltage is applied by the first electrode 29 and the second electrode 31. The light-emitting layer 36 is formed of a material that varies in accordance with a luminescent color (for example, red, green, or blue) of the organic EL element 9 in the individual subpixel 6.

Examples of a material of the light-emitting layer 36 include a metal oxinoid compound (8-hydroxyquinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, polysilane, and the like.

The electron transport layer 37 has a function of efficiently making an electron move to the light-emitting layer 36. Examples of a material of the electron transport layer 37 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, a metal oxinoid compound, and the like as an organic compound.

The electron injection layer 38 is also referred to as a cathode buffer layer and has a function of improving the efficiency of electron injection from the second electrode 31 into the organic EL layer 30 by bringing energy levels of the second electrode 31 and the organic EL layer 30 close to each other. Examples of a material of the electron injection layer 38 include an inorganic alkaline compound such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); strontium oxide (SrO); and the like.

As illustrated in FIG. 4, the second electrode 31 is provided and shared by the plurality of first electrodes 29 (that is, shared by the plurality of subpixels 6) and covers the organic EL layer 30. The second electrode 31 is electrically connected to a low voltage power source wiring line, and electrical conduction is allowed between the second electrode 31 and a low voltage power source (ELVSS) by the wiring line terminal 15t provided in the terminal portion T through the low voltage power source wiring line. The second electrode 31 has a function of injecting an electron into the organic EL layer 30 and is preferably formed of a material having a small work function to improve the efficiency of electron injection into the organic EL layer 30.

Examples of a material of the second electrode 31 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and the like.

Additionally, a material of the second electrode 31 may be an alloy of magnesium (Mg)-copper (Cu), an alloy of magnesium (Mg)-silver (Ag), an alloy of sodium (Na)-potassium (K), an alloy of astatine (At)-astatine oxide ($AtO_2$), an alloy of lithium (Li)-aluminum (Al), an alloy of lithium (Li)-calcium (Ca)-aluminum (Al), or the like.

Additionally, for example, the material of the second electrode 31 may be a conductive oxide such as tin oxide (SnO), zinc oxide (ZnO), indium tin oxide (ITO), or indium zinc oxide (IZO). Additionally, the second electrode 31 may be formed by layering a plurality of layers including the materials described above. Note that examples of the material having a small work function include magnesium (Mg), lithium (Li), lithium fluoride (LiF), an alloy of magnesium (Mg)-copper (Cu), an alloy of magnesium (Mg)-silver (Ag), an alloy of sodium (Na)-potassium (K), an alloy of lithium (Li)-calcium (Ca)-aluminum (Al), an alloy of lithium fluoride (LiF)-calcium (Ca)-aluminum (Al), and the like.

Sealing Film

The sealing film 10 functions to protect the organic EL element 9 from moisture, oxygen, or the like. As illustrated in FIG. 4, the sealing film 10 includes a first inorganic layer 39 provided to cover the organic EL element 9, an organic layer 40 provided on the first inorganic layer 39, and a second inorganic layer 41 provided to cover the organic layer 40.

The first inorganic layer 39 and the second inorganic layer 41 are formed of an inorganic material such as silicon oxide ($SiO_2$), aluminum oxide ($Al_2O_3$), silicon nitride (SiNx (x is a positive number)) like trisilicon tetranitride ($Si_3N_4$), or silicon carbonitride (SiCN). The organic layer 40 is formed of an organic material such as an acrylic resin, an epoxy resin, a polyurea resin, a parylene resin, a polyimide resin, or a polyamide resin.

The first inorganic layer 39, the organic layer 40, and the second inorganic layer 41 are provided in the entirety of the display region D and are also provided in the frame region F. All of the peripheral end portions of the first inorganic layer 39, the organic layer 40, and the second inorganic layer 41 are positioned in the frame region F. The peripheral end portions of the first inorganic layer 39 and the second inorganic layer 41 are positioned in a portion outside the frame region F, and the peripheral end portion of the organic layer 40 is positioned closer to the display region D side than both the peripheral end edges of the first inorganic layer 39 and the second inorganic layer 41.

Configuration of Frame Region

Figure 6:
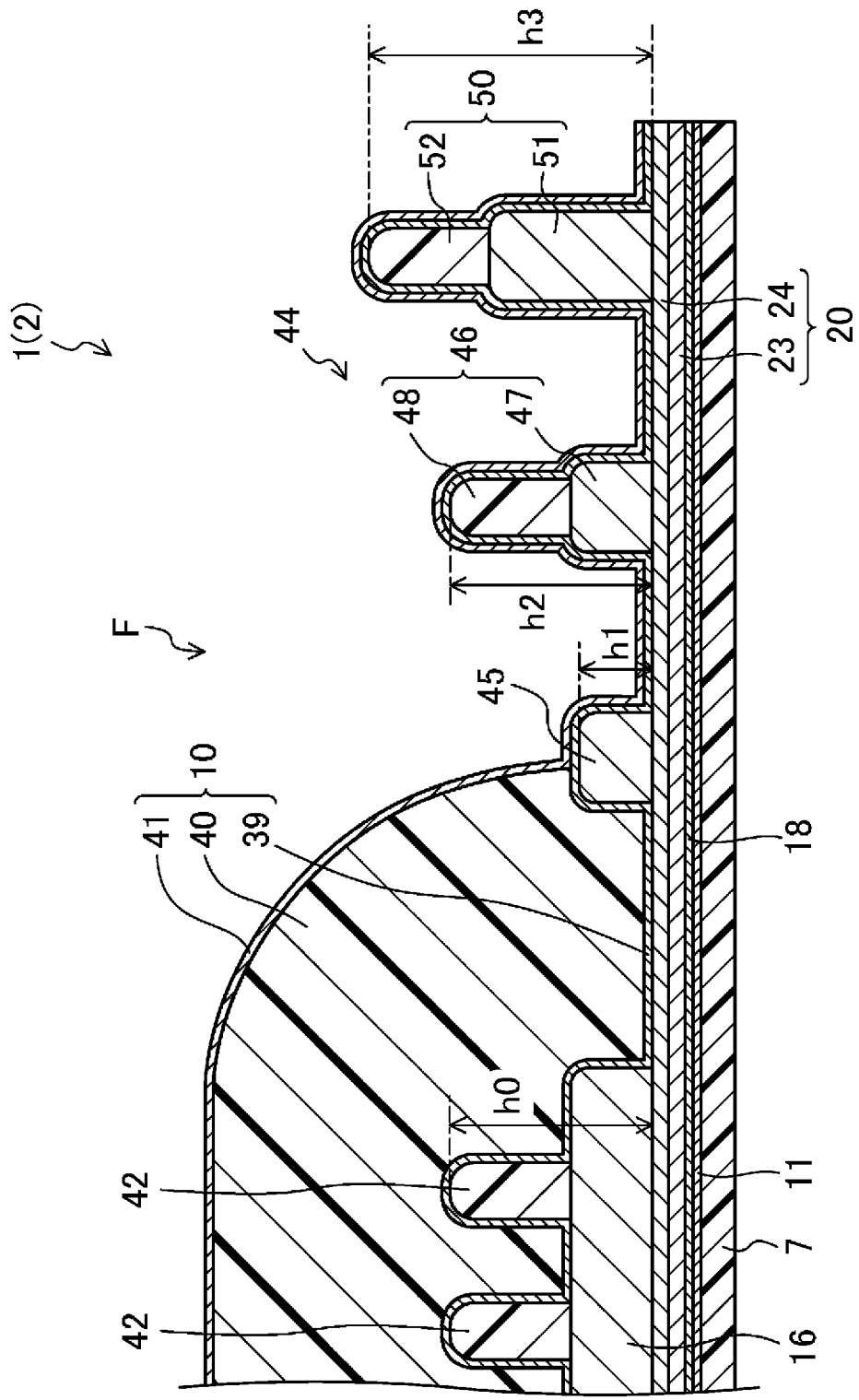
FIG. 6 is a cross-sectional view of a frame region of the display panel taken along line VI-VI in FIG. 1.

As illustrated in FIG. 6, in the frame region F, the photospacer 42 is provided on the flattening film 16, and a dam structure 44 for damming back the spread of an organic material, which is formed into the organic layer 40, to the outside of the frame region F at the time of applying the organic material is provided in the manufacturing process for the organic EL display device 1. The dam structure 44 includes a first dam wall 45 and a second dam wall 46 which are provided to surround the display region D. The first dam wall 45 and the second dam wall 46 are formed in a frame shape conforming to the outer peripheral shape of the display region D throughout the entire outer periphery of the flattening film 16, and have similar shapes and disposed with an interval therebetween in the width direction of the frame region F.

The first dam wall 45 is provided on the display region D side and is disposed inside the second dam wall 46. The first dam wall 45 is composed of a single layer formed of the same material in the same layer as the flattening film 16 on the interlayer insulating film 20. The first dam wall 45 overlaps the peripheral end portion of the organic layer 40 constituting the sealing film 10 and limits the formation region of the organic layer 40. The organic layer 40 is fully provided on the inner side of the first dam wall 45.

On the other hand, the second dam wall 46 is disposed outside the first dam wall 45 and is provided to surround the first dam wall 45. The second dam wall 46 includes a structure in which a first wall layer 47 and a second wall layer 48 are layered in this order on the interlayer insulating film 20. The first wall layer 47 is formed of the same material in the same layer as the flattening film 16 and has the same height h1 as a height h1 of the first dam wall 45. The second wall layer 48 is formed of the same material in the same layer as the edge cover 33 and has the same height as a height h0 of the photospacer 42. In this manner, a height h2 of the second dam wall 46 is greater than the height h1 of the first dam wall 45 composed of only a single layer corresponding to the first wall layer 47 by the second dam wall 46 being composed of two layers of the first wall layer 47 and the second wall layer 48 and is similar to the height h0 of the photospacer 42. Here, each of the height h0 of the photospacer 42, the height h1 of the first dam wall 45, and the height h2 of the second dam wall 46 indicates a distance from the surface of the interlayer insulating film 20 to a surface located on a side opposite to the interlayer insulating film 20.

The first dam wall 45 and the second dam wall 46 are in a partially overlapping positional relationship by intersecting various lead wiring lines 15f, or the like. Specifically, for example, the lead wiring line 15f electrically connected to the source wiring line 15s in the display region D intersects the first dam wall 45 and the second dam wall 46 at a portion constituting one side of the frame region F where the terminal portion T is provided. In addition, a low voltage power source wiring line not illustrated in the drawing also partially overlaps at least one dam wall out of the first dam wall 45 and the second dam wall 46.

In addition, a protruding portion 50 is provided in the frame region F to surround the dam structure 44. The protruding portion 50 is formed in a frame shape conforming to the outer peripheral shape of the display region D in the same manner as the first dam wall 45 and the second dam wall 46, has a similar shape to the first dam wall 45 and the second dam wall 46, and is disposed outside the second dam wall 46 with an interval therebetween. The protruding portion 50 is provided throughout the entire periphery of the frame region F.

The forming position of such a protruding portion 50 also includes a position facing the rounded corner portions Da and the notch portion Db in the display region D through the first dam wall 45 and the second dam wall 46. A portion of the protruding portion 50 which is formed at a position facing the rounded corner portions Da in the display region D is formed to have a shape conforming to the outer edge of the corresponding rounded corner portion Da. Furthermore, a portion of the protruding portion 50 which is formed at a position facing the notch portion Db in the display region D is formed to have a shape conforming to the outer edge of the notch portion Db.

The protruding portion 50 has a structure in which a first convex layer 51 and a second convex layer 52 are layered in this order on the interlayer insulating film 20. The first convex layer 51 is formed of the same material in the same layer as the flattening film 16 using a gray tone mask and is thicker than the flattening film 16, the first dam wall 45, and the first wall layer 47 of the second dam wall 46. The second convex layer 52 is formed of the same material in the same layer as the edge cover 33. In this manner, a height h3 of the protruding portion 50 is greater than the height h0 of the photospacer 42, the height h1 of the first dam wall 45, and the height h2 of the second dam wall 46 by the first convex layer 51 being formed to be relatively thick. Here, the height h3 of the protruding portion 50, likewise the height h0 of the photospacer 42, the height h1 of the first dam wall 45, and the height h2 of the second dam wall 46, indicates a distance from the surface of the interlayer insulating film 20 to a surface located on a side opposite to the interlayer insulating film 20. In the manufacturing process for the organic EL display device 1, the protruding portion 50 serves as a spacer that preferentially comes into contact with the film forming mask 70 which is used to form a vapor deposition film.

The organic layer 40 is dammed back by the first dam wall 45 and is not provided in an outer side of the first dam wall 45. Such an organic layer 40 covers various elements including the organic EL element 9; and a control circuit such as a gate driver circuit and functions as a buffer layer that covers foreign substances to prevent a defect from being generated in the sealing film 10, in a case where the foreign substances are present at locations where the various elements and circuits are formed. The first inorganic layer 39 and the second inorganic layer 41 cover both the first dam wall 45, the second dam wall 46, and the protruding portion 50. The peripheral end portions of the first inorganic layer 39 and the second inorganic layer 41 are bonded to each other outside the first dam wall 45. The organic layer 40 is surrounded by the first inorganic layer 39 and the second inorganic layer 41 and is enclosed between the two inorganic layers 39 and 41.

In the organic EL display device 1 having the above-described configuration, in each of the subpixels 6, a gate signal is input to the first TFT 12 through the gate wiring line 15g to turn on the first TFT 12, a predetermined voltage corresponding to a source signal is written in the gate electrode 19 of the second TFT 13 and the capacitor 14 through the source wiring line 15s, and a current corresponding to a gate voltage of the second TFT 13 is supplied from the high voltage power source wiring line 15hp to the organic EL element 9, whereby the organic EL layer 30 (the light-emitting layer 36) emits light, and an image is displayed. Note that, in the organic EL display device 1, even when the first TFT 12 is turned off, the gate voltage of the second TFT 13 is held by the capacitor 14, and thus light emission performed by the organic EL layer 30 is maintained for each subpixel 6 until a gate signal of the next frame is input.

Such an organic EL display device 1 is manufactured by a so-called multi-chamfering method for obtaining a plurality of display panels 2 constituting the display device 1, by using a mother substrate 60 including a plurality of the panel constituent regions 61 constituting the resin substrate layer 7 of the display panel 2, by fabricating the TFT layer 8, the organic EL element 9, and the sealing film 10 in each panel constituent region 61 with respect to the mother substrate 60 and then dividing the mother substrate 60 in units of display panels. In the manufacturing process for the organic EL display device 1, vacuum vapor deposition is performed using the film forming mask 70 to form the organic EL layer 30. Hereinafter, a method of manufacturing the film forming mask 70 and the organic EL display device 1 using the same will be described.

Configuration of Film Forming Mask

Figure 7:
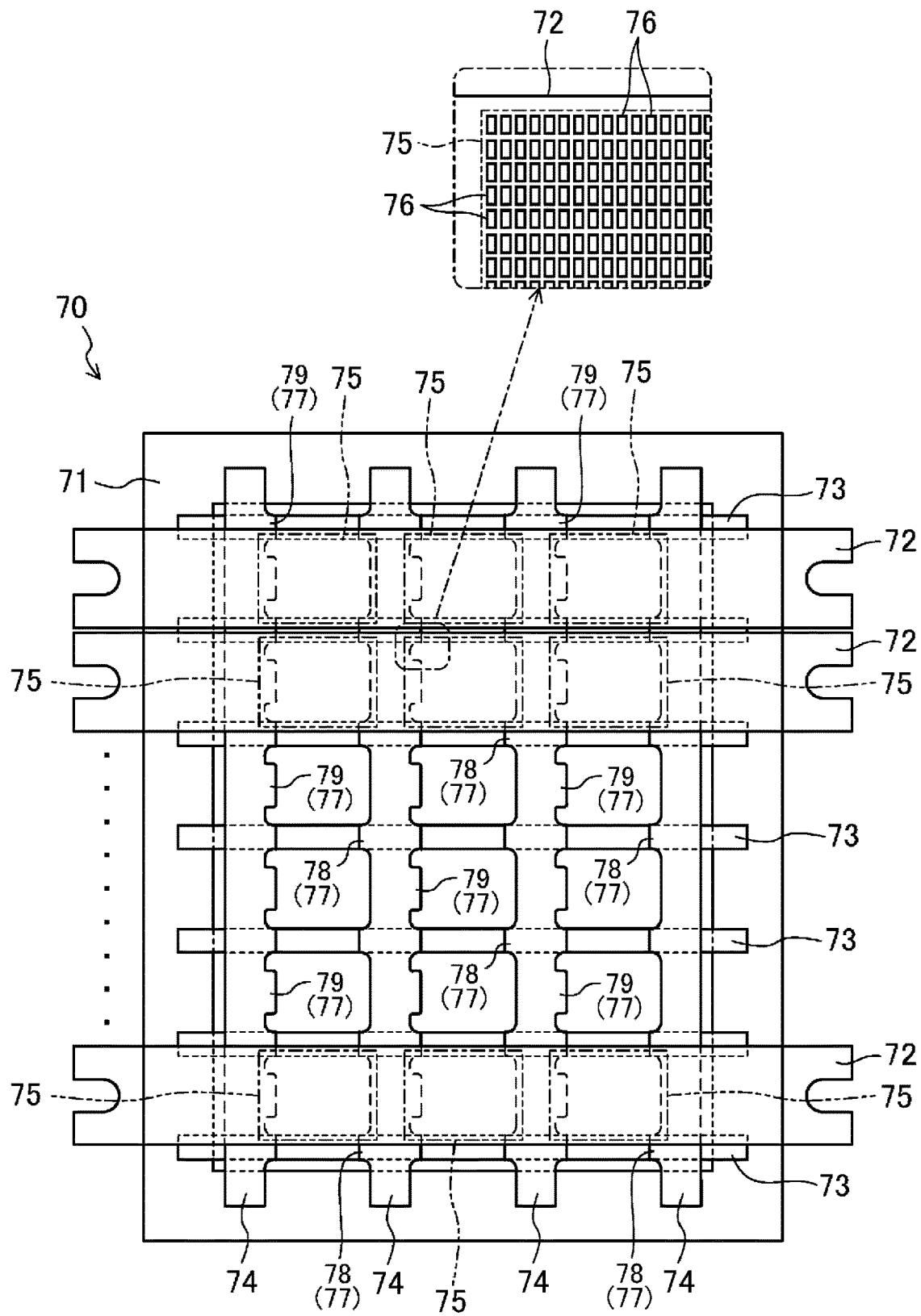
FIG. 7 is a plan view illustrating a schematic configuration of a film forming mask used to manufacture the organic EL display device according to the first embodiment.

FIG. 7 is a plan view illustrating a schematic configuration of the film forming mask 70. Note that, for convenience of description, in FIG. 7, some mask sheets 72 disposed in the middle of a plurality of the mask sheets 72 and some through-holes 76 of a plurality of the through-holes 76 formed in the mask sheets 72 are omitted. The film forming mask 70 is a mask called a fine metal mask (FMM) which can be patterned in units of subpixels and is used to form a vapor deposition film of each layer constituting the organic EL layer 30.

As illustrated in FIG. 7, the film forming mask 70 includes: a mask frame 71 having a rectangular frame shape; the plurality of mask sheets 72 stretched from a portion constituting one side of the mask frame 71 to a portion constituting a side opposite thereto; a plurality of cover sheets 73 that shield a gap between the adjacent mask sheets 72; and a plurality of supporting sheets 74 that support the plurality of mask sheets 72. Here, the supporting sheet 74 is an example of a supporting member.

The plurality of mask sheets 72 are formed into strips and are disposed with an interval therebetween in a direction (an up-down direction in FIG. 7) orthogonal to the direction of stretching over the mask frame 71 (a left-right direction in FIG. 7). The mask sheet 72 is a masking member having a sheet shape and is configured such that portions on two end sides in a longitudinal direction are fixed and stretched by welding or the like through irradiation with a laser beam with respect to the mask frame 71 in a state where tension is applied.

In the mask sheet 72, a vapor deposition pattern opening 75 in which the plurality of through-holes 76 are formed in units of subpixels is provided to correspond to each opening formed between lattices of the cover sheet 73 and the supporting sheet 74. The plurality of through-holes 76 are holes that allow particles of a vapor deposition material to pass therethrough and are provided uniformly within the vapor deposition pattern opening 75. The configuration of such a vapor deposition pattern opening 75 is effective in facilitating the achievement of accuracy of the forming position of the vapor deposition film in a state where the mask sheet 72 is stretched over the mask frame 71.

The plurality of cover sheets 73 are formed into a narrow plate shape extending linearly, are stretched over the mask frame 71 in the same direction as the mask sheets 72, and are disposed at positions corresponding to gaps between the mask sheets 72 so as to be spaced apart from each other in a direction orthogonal to the direction of stretching over the mask frame 71. Portions on two end sides of the cover sheet 73 are fixed by fitting into recesses provided in the mask frame 71, which are not illustrated in the drawing. A space between the adjacent cover sheets 73 is set to a distance equivalent to a lateral width w1 of the display region D of the display panel 2.

The plurality of supporting sheets 74 are formed into a narrow plate shape extending linearly, are stretched over the mask frame 71 in a direction orthogonal to the mask sheets 72, and are disposed to be spaced apart from each other in a direction orthogonal to the direction of stretching over the mask frame 71. Portions on two end sides of the supporting sheet 74 are fixed by fitting into recesses provided in the mask frame 71, which are not illustrated in the drawing. A space between the adjacent supporting sheets 74 is set to a distance equivalent to a vertical width w2 of the display region D of the display panel 2.

A shielding portion 77 that partially shields the plurality of through-holes 76 formed in the opening 75 of the mask sheet 72 is provided in the supporting sheets 74. The shielding portion 77 is a mask component for forming variant portions such as the rounded corner portion Da and the notch portion Db in the display region D of the display panel 2 as a shape in which a vapor deposition region with respect to the panel constituent region 61 of the mother substrate 60 is partially omitted at the corresponding location of the shielding portion 77, and is formed integrally with the supporting sheet 74.

In the supporting sheet 74 other than two ends in the plurality of supporting sheets 74, a plurality of first shielding portions 78 that protrude with a contour tracing the outer edges of the rounded corner portions Da on the terminal portion T side in the display region D are provided at intervals in a longitudinal direction at a side portion (the left portion in the example illustrated in FIG. 7) on one side in the width direction of the supporting sheet 74. In addition, the plurality of first shielding portions 78 that protrude with a contour tracing the outer edges of the rounded corner portions Da on both sides of the notch portion Db in the display region D; and a plurality of second shielding portions 79 that protrude with a contour tracing the outer edge of the notch portion Db in the display region D are alternately disposed at intervals in the longitudinal direction at a side portion (the right portion in the example illustrated in FIG. 7) on the other side in the width direction of the supporting sheet 74.

In the supporting sheet 74 positioned at one end among the plurality of supporting sheets 74, the plurality of first shielding portions 78 that protrude with a contour tracing the outer edge of the rounded corner portion Da on the terminal portion T side in the display region D are provided at intervals in the longitudinal direction at only a side portion on a side facing inward the opening of the mask frame 71 in the width direction of the supporting sheet 74. Further, in the supporting sheet 74 positioned at the other end, the plurality of first shielding portions 78 that protrude with a contour tracing the outer edges of the rounded corner portions Da on both sides of the notch portion Db in the display region D; and the plurality of second shielding portions 79 that protrude with a contour tracing the outer edge of the notch portion Db in the display region D are alternately disposed at intervals in the longitudinal direction at only a side portion on a side facing inward the opening of the mask frame 71 in the width direction of the supporting sheet 74.

The plurality of cover sheets 73, the plurality of supporting sheets 74, and the mask sheet 72 which are described above are fixed to the mask frame 71 in this order from a vapor deposition source 85 side when installed in a vacuum vapor deposition device 80. The mask frame 71, the mask sheets 72, the cover sheets 73, and the supporting sheets 74 are all formed of a metal material having a low coefficient of thermal expansion so as to inhibit the occurrence of warping or distortion during film formation processing. Examples of such a metal material include Invar, stainless steel, nickel (Ni), cobalt (Co), an alloy of nickel (Ni)-cobalt (Co), and the like, and among these, Invar is preferably used.

Method of Manufacturing Organic EL Display Device

Figure 8:
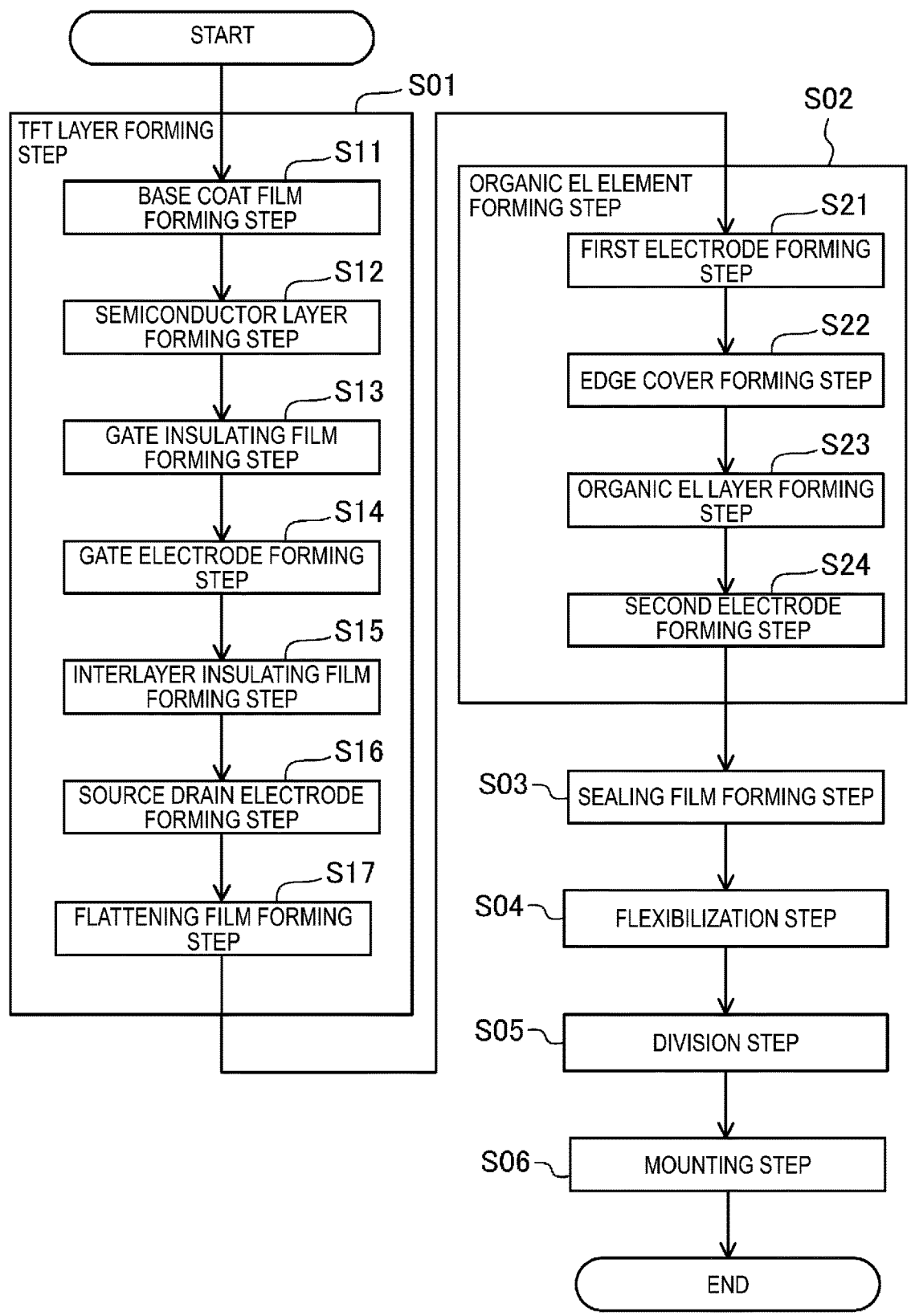
FIG. 8 is a schematic flowchart of a method of manufacturing the organic EL display device according to the first embodiment.
Figure 9:
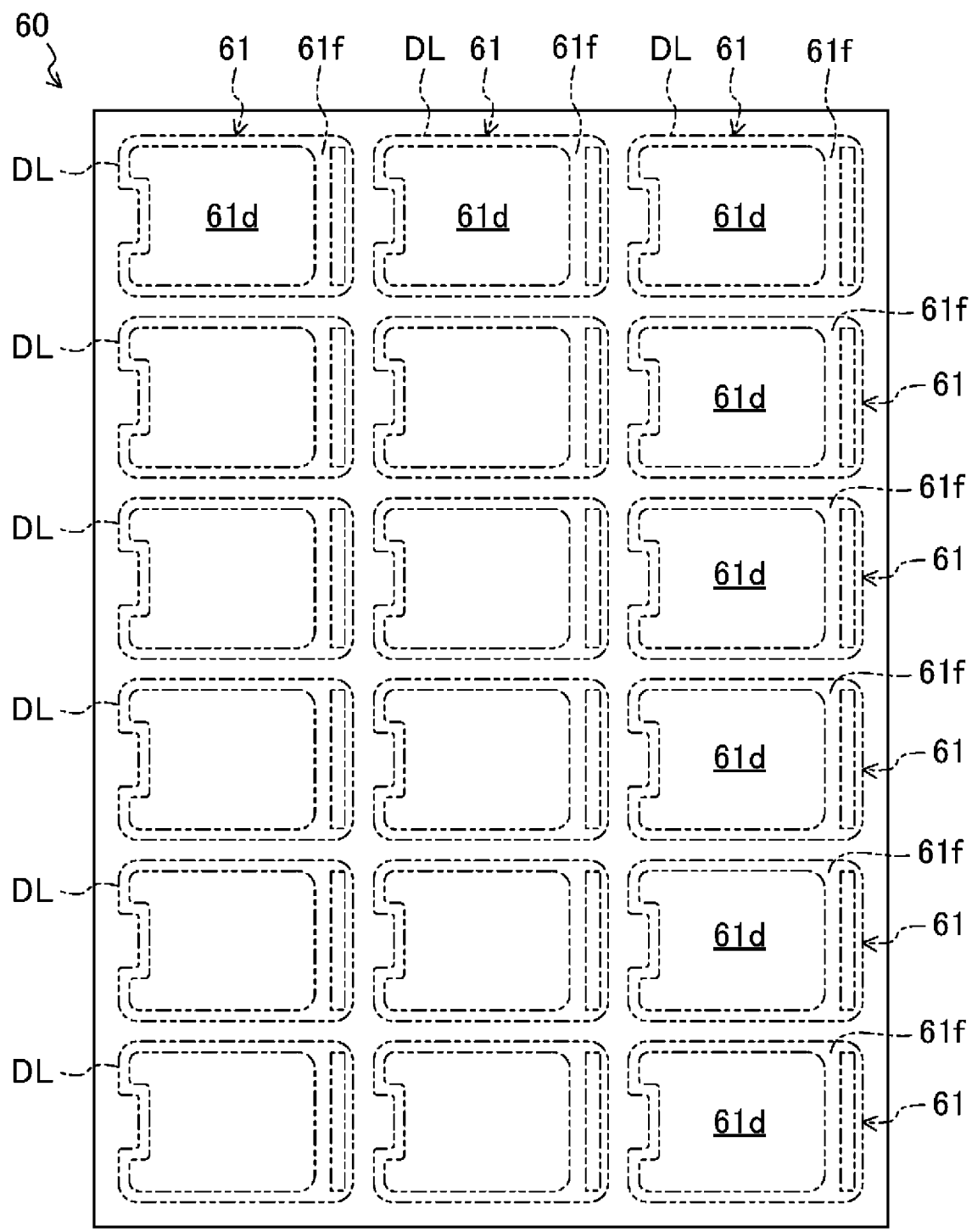
FIG. 9 is a plan view illustrating a schematic configuration of a mother substrate used to manufacture the organic EL display device according to the first embodiment.
Figure 10:
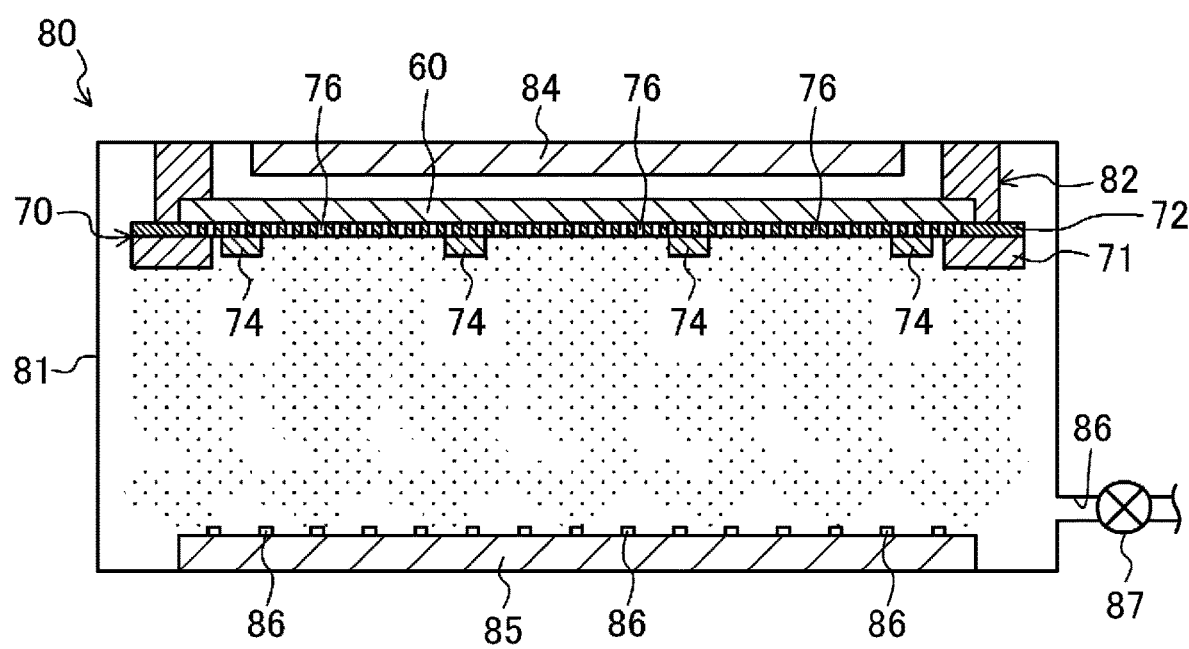
FIG. 10 is a diagram illustrating the state of an organic EL layer forming step in the method of manufacturing the organic EL display device according to the first embodiment.
Figure 11:
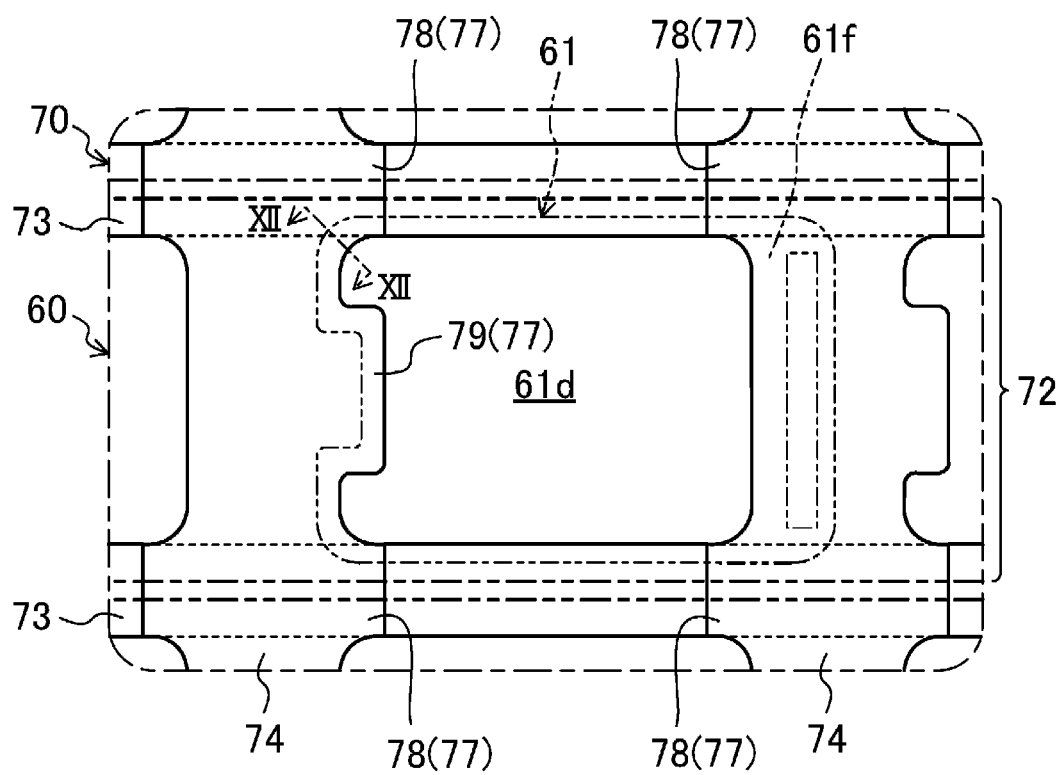
FIG. 11 is a plan view illustrating one panel constituent region in a mother substrate and a corresponding portion of the film forming mask in the organic EL layer forming step in the method of manufacturing the organic EL display device according to the first embodiment.
Figure 12:
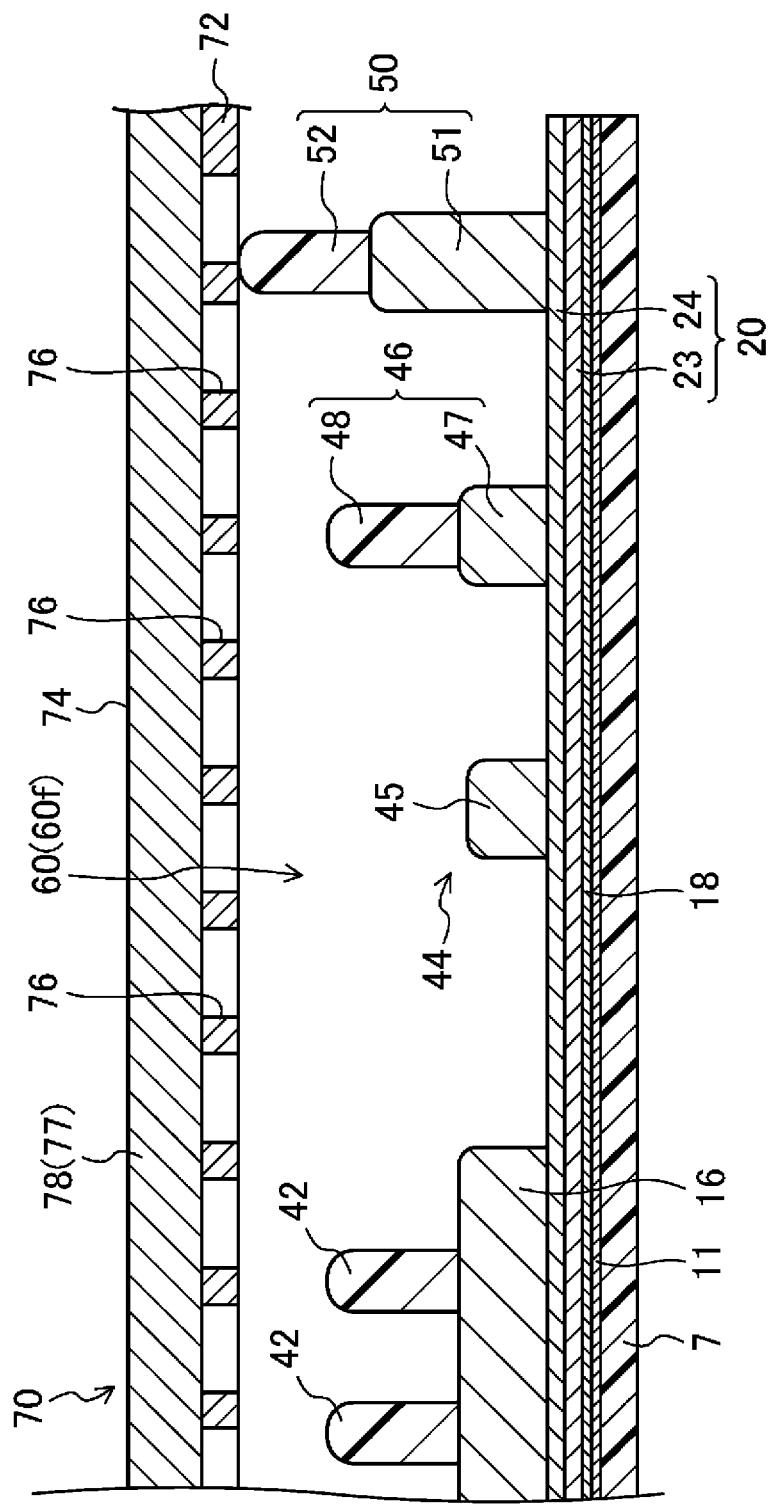
FIG. 12 is a cross-sectional view of the frame region of the display panel taken along line XII-XII in FIG. 11.

FIG. 8 is a schematic flowchart of a method of manufacturing the organic EL display device 1. FIG. 9 is a plan view of the mother substrate 60 which is used to manufacture the organic EL display device 1. FIG. 10 is a diagram illustrating the state of an organic EL layer forming step S23 in the method of manufacturing the organic EL display device 1. FIG. 11 is a plan view illustrating one panel constituent region 61 in the mother substrate 60 and a corresponding portion of the film forming mask 70 in the organic EL layer forming step S23. FIG. 12 is a cross-sectional view of the frame region F of the display panel 2 taken along line XII-XII in FIG. 10.

As illustrated in FIG. 8, the method of manufacturing the organic EL display device 1 includes a TFT layer forming step S01, an organic EL element forming step S02, a sealing film forming step S03, a flexibilization step S04, a division step S05, and a mounting step S6.

A multi-chamfering method is adopted for the manufacture of the organic EL display device 1, and the above-described steps are performed using the mother substrate 60 as illustrated in FIG. 9. The mother substrate 60 is a substrate serving as the resin substrate layer 7 and includes the plurality of panel constituent regions 61 that constitute the display panel 2. For example, the plurality of panel constituent regions 61 are disposed in a matrix shape. The individual panel constituent region 61 includes a portion 61d constituting the display region D and a portion 61f constituting the frame region F including the terminal portion T. Such a mother substrate 60 is used to manufacture the organic EL display device 1 in a state where the mother substrate 60 is formed on a glass substrate. In the manufacture of the organic EL display device 1, the display region D is provided such that the outer peripheral shape is a variant shape having the rounded corner portions Da at four corners and the notch portion Db as the portion 61d constituting the display region D illustrated in FIG. 9, the variant shape being different from a rectangular shape.

TFT Layer Forming Step

The TFT layer forming step S01 includes a base coat film forming step S11, a semiconductor layer forming step S12, a gate insulating film forming step S13, a gate electrode forming step S14, an interlayer insulating film forming step S15, a source drain electrode forming step S16, and a flattening film forming step S17.

In the base coat film forming step S11, an inorganic insulating film such as silicon oxide (SiOx), silicon nitride (SiNx), silicon oxynitride (SiOxNy; x>y), or silicon nitride oxide (SiNxOy; x>y) is formed on the surface of the mother substrate 60 formed on the glass substrate by, for example, a plasma chemical vapor deposition (CVD) method to form the base coat film 11.

In the semiconductor layer forming step S12 to be performed subsequently, the semiconductor layer 17 is formed by: forming a semiconductor film on the mother substrate 60 having the base coat film 11 formed thereon, for example, by a CVD method, performing crystallization treatment or low-resistance treatment on the semiconductor film as necessary, and then patterning the semiconductor film by photolithography (resist coating processing, prebaking processing, exposure processing, developing processing, postbaking processing, etching processing, and resist peeling processing).

In the gate insulating film forming step S13 to be performed subsequently, the gate insulating film 18 is formed by forming an inorganic insulating film such as silicon oxide (SiOx), silicon nitride (SiNx), silicon oxynitride (SiOxNy; x>y), or silicon nitride oxide (SiNxOy; x>y) as a single layer or a laminated layer on the mother substrate 60 having the semiconductor layer 17 formed thereon.

In the gate electrode forming step S14 to be performed subsequently, the gate electrode 19 is formed by forming a titanium film, an aluminum film, and a titanium film in order on the mother substrate 60 having the gate insulating film 18 formed thereon, for example, by a sputtering method to form a layered conductive film, and then patterning the layered conductive film by photolithography. At this time, the gate wiring lines 15*g*, the various lead wiring lines 15*f*, and the like are also formed from the layered conductive film that forms the gate electrode 19.

In the interlayer insulating film forming step S15 to be performed subsequently, the first interlayer insulating film 23 is formed by forming an inorganic insulating film such as silicon oxide (SiOx), silicon nitride (SiNx), silicon oxynitride (SiOxNy; x>y), or silicon nitride oxide (SiNxOy; x>y) on the mother substrate 60 having the gate electrode 19 formed thereon, for example, by a CVD method.

Subsequently, the upper conductive layer 27 of the capacitor 14 is formed by forming a titanium film, an aluminum film, and a titanium film in order on the first interlayer insulating film 24, for example, by a sputtering method to form a layered conductive film, and then patterning the layered conductive film by photolithography.

Then, the second interlayer insulating film 24 is formed by forming an inorganic insulating film such as silicon oxide (SiOx), silicon nitride (SiNx), silicon oxynitride (SiOxNy; x>y), or silicon nitride oxide (SiNxOy; x>y) on the first interlayer insulating film 23 having the upper conductive layer 27 formed thereon, for example, a CVD method.

In this manner, the interlayer insulating film 20 in which the first interlayer insulating film 23 and the second interlayer insulating film 24 are layered is formed. Then, the interlayer insulating film 20 is patterned by photolithography to form the contact holes 25. At this time, the contact holes 25 are also formed in the gate insulating film 18.

In the source drain electrode forming step S16 to be performed subsequently, the source electrode 21 and the drain electrode 22 are formed by forming a titanium film, an aluminum film, and a titanium film in order on the mother substrate 60 having the interlayer insulating film 20 formed thereon, for example, by a sputtering method to form a layered conductive film and then patterning the layered conductive film by photolithography. At this time, the source wiring lines 15*s*, the high voltage power source wiring lines 15*hp*, and the like are also formed from the layered conductive film that forms the source electrode 21 and the drain electrode 22.

In the flattening film forming step S17 to be performed subsequently, a photosensitive resin material such as a photosensitive polyimide resin is applied to the mother substrate 60 having the source electrode 21 and the drain electrode 22 formed thereon by a known coating method such as a spin coating method. Then, the flattening film 16 is formed by performing pre-baking processing, exposure processing, developing processing, and post-baking processing on a coating film of the photosensitive resin material; and patterning the coating film. At this time, the first dam wall 45, the first wall layer 47 of the second dam wall 46, and the first convex layer 51 of the protruding portion 50 are also formed from the coating film that forms the flattening film 16. In the patterning of the coating film at that time, the first convex layer 51 of the protruding portion 50 is formed thicker than the flattening film 16, the first dam wall 45, and the first wall layer 47 of the second dam wall 46 by adjusting the amount of exposure so as to differ between a region in which the first convex layer 51 being a protruding portion in the coating film is formed and a region in which the flattening film 16, the first dam wall 45, and the first wall layer 47 of the second dam wall 46 are formed, using a gray tone mask in the exposure processing. Note that a halftone mask may be used here instead of a gray tone mask.

In this manner, in the TFT layer forming step S01, the TFT layer 8 is formed on the mother substrate 60.

Organic EL Element Forming Step

The organic EL element forming step S02 includes a first electrode forming step S21, an edge cover forming step S22, an organic EL layer forming step S23, and a second electrode forming step S24. Note that the organic EL element forming step S02 is an example of a light-emitting element forming step.

In the first electrode forming step S21, a layered conductive film is formed by forming an indium tin oxide (ITO) film, a silver alloy film, and an indium tin oxide (ITO) film in order on the mother substrate 60 having the TFT layer 8 formed thereon, for example, by a sputtering method. In addition, the layered conductive film is patterned by photolithography to form the first electrode 29.

In the edge cover forming step S22 to be performed subsequently, a photosensitive resin material such as a photosensitive polyimide resin is applied to the mother substrate 60 having the first electrode 29 formed thereon by a known coating method such as a spin coating method. Then, the edge cover 33 is formed by performing pre-baking processing, exposure processing, developing processing, and post-baking processing on a coating film of the photosensitive resin material; and patterning the coating film. At this time, the photospacer 42, the second wall layer 48 of the second dam wall 46, and the second convex layer 52 of the protruding portion 50 are also formed from the coating film that forms the edge cover 33. In the patterning of the coating film at that time, the photospacer 42 is also formed in the edge cover 33 by adjusting the amount of exposure so as to differ between a portion in which the photospacer 42 is formed in the formation region of the edge cover 33 in the coating film and a portion in which the photospacer 42 is not formed, using a gray tone mask in the exposure processing. Note that a halftone mask may be used here instead of a gray tone mask.

In this manner, the second dam wall 46 is formed, and the protruding portion 50 larger in height than the second dam wall 46 is formed in an island shape conforming to the outer edges of the rounded corner portions Da and the notch portion Db with respect to the rounded corner portions Da and the notch portion Db in the display region D. The protruding portion 50 is formed at a position facing each of the rounded corner portions Da and the notch portion Db through the first dam wall 45 and the second dam wall 46 on the outer side of the second dam wall 46 in the frame region F. The position at which the protruding portion 50 is formed is a position facing the shielding portion 77 of the supporting sheet 74 when the film forming mask 70 is used to form the layers of the organic EL layer 30.

In the organic EL layer forming step S23 to be performed subsequently, the organic EL layer 17 is formed on each of the first electrodes 29 by forming the hole injection layer 34, the hole transport layer 35, the light-emitting layer 36, the electron transport layer 37, and the electron injection layer 38 in order on the mother substrate 60 having the edge cover 33 formed thereon using the film forming mask 70 which is the above-described FMM, for example, by a vacuum vapor deposition technique.

Specifically, layers constituting the organic EL layer 30 are formed using the vacuum vapor deposition device 80 as illustrated in FIG. 10. The vacuum vapor deposition device 80 includes a film formation chamber 81, a substrate holder 82 provided inside the film formation chamber 81, the film forming mask 70 having the above-described configuration, a magnetic force portion 84, and a vapor deposition source 85.

The film formation chamber 81 has an exhaust port 86 connected to a vacuum pump not illustrated in the drawing and is configured such that an internal space can be maintained in a reduced pressure state by a gate valve 87 provided in the exhaust port 86 by evacuating the chamber through the exhaust port 86 through the operation of a pressure adjusting mechanism such as a pump not illustrated in the drawing.

The substrate holder 82 is disposed on the upper side of the film formation chamber 81. The substrate holder 82 holds the mother substrate 60 with a glass substrate using an electrostatic chuck or the like in a posture in which a film formation target surface of the mother substrate 60 (a surface on which the edge cover 33 is formed) faces downward, the mother substrate 60 being a substrate on which the edge cover 33 is formed and serving as a substrate to be processed.

The film forming mask 70 is disposed to face the film formation target surface below the mother substrate 60 held by the substrate holder 82 and is installed in a posture in which the mask sheet 72 faces the mother substrate 60. The magnetic force portion 84 is composed of a component that generates a magnetic force such as an electromagnet and is disposed to face the film forming mask 70 through the mother substrate 60 held by the substrate holder 82.

This magnetic force portion 84 has a positional relationship in which the mask sheet 72 of the film forming mask 70 is drawn by the action of a magnetic force to prevent warping in the mask sheet 72, and the mask sheet 72 is brought close to the film formation target surface of the mother substrate 60 held by the substrate holder 82 and spaced apart from the film formation target surface at a fixed distance or has a positional relationship in which the mask sheet 72 and the film formation target surface are brought into contact with each other. This is advantageous in improving the uniformity or adhesion of a distance between the mask sheet 72 and the film formation target surface of the mother substrate 60, and contributes to a reduction in a so-called shadow phenomenon that leads to a film blur or an uneven pattern during vapor deposition.

The vapor deposition source 85 is installed on the lower side of the film formation chamber 81. The vapor deposition source 85 constitutes a container contains a vapor deposition material therein and includes a plurality of discharge ports 86 facing upward. Then, the vapor deposition source 85 includes a built-in heater, vaporizes (evaporates or sublimates) the contained vapor deposition material by heating using a heater, and discharges the vaporized vapor deposition material upward from the discharge ports 86.

The vacuum vapor deposition device 80 having the above-described configuration has a predetermined positional relationship in which the inside of the film formation chamber 81 is evacuated in a state where the mother substrate 60 is held by the substrate holder 82 and the mask sheet 72 of the film forming mask 70 faces the mother substrate 60 due to the operation of the magnetic force portion 84, and the vapor deposition material is discharged from the vapor deposition source 85 to the mother substrate 60. Thus, the vapor deposition material having passed through the plurality of through-holes 76 in the vapor deposition pattern opening 75 of each of the mask sheets 72 in the film forming mask 70 is deposited onto the film formation target surface of the mother substrate 60, whereby any layer (vapor deposition film) that constitutes the organic EL layer 30 is formed at a location corresponding to the through-holes 76 of the film forming mask 70 on the surfaces of the panel constituent regions 61 of the mother substrate 60.

When the layers of the organic EL layer 30 are formed using the vacuum vapor deposition device 80 in this manner, the shielding portion 77 of the supporting sheet 74 constituting the film forming mask 70 is disposed to face a portion of each of the panel constituent regions 61 in the mother substrate 60 constituting the frame region F, as illustrated in FIG. 11. In this state, the supporting sheet 74 is drawn to the mother substrate 60 side due to a magnetic force, and thus the mask sheet 72 may be displaced to be firmly pressed against the mother substrate 60 by the shielding portion 77. In the manufacture of an organic EL display device in the related art, the mask sheet displaced in this manner comes into contact with a dam wall, and thus the dam wall is worn due to a contact with the mask sheet, which leads to a concern that foreign substances may be generated at a corresponding location of the dam wall and the surroundings thereof. However, as illustrated in FIG. 12, in the manufacture of the organic EL display device 1 according to the first embodiment, the mask sheet 72 preferentially comes into contact with the protruding portion 50 provided on the outer periphery of the second dam wall 46, and thus the first dam wall 45 and the second dam wall 46 are prevented from coming into contact with the shielding portion 77. Thereby, it is possible to inhibit the generation of foreign substances at the corresponding locations of the first dam wall 45 and the second dam wall 46 and on the display region D side thereof.

In the second electrode forming step S24 to be performed subsequently, the second electrode 31 is formed by forming a silver alloy film on the mother substrate 60 having the organic EL layer 30 formed thereon using a film forming mask called a common metal mask (CMM) which can be patterned in units of display panels, for example, by a vacuum vapor deposition technique.

In this manner, in the organic EL element forming step S02, the organic EL element 9 is formed on the TFT layer 8.

Sealing Film Forming Step

In the sealing film forming step S03, the first inorganic layer 39 is formed by forming an inorganic insulating film such as silicon oxide (SiOx), silicon nitride (SiNx), silicon oxynitride (SiOxNy; x>y), or silicon nitride oxide (SiNxOy; x>y) as a single layer or a laminated layer on the mother substrate 60 having the organic EL element 9 formed thereon using a film forming mask which is a CMM, for example, by a CVD method.

Subsequently, the organic layer 40 is formed on the mother substrate 60 having the first inorganic layer 39 formed thereon by applying an organic material such as an acrylic resin, for example, by an ink-jet method. At this time, the spread of the applied organic material to the outside of the frame region F is dammed back by the first dam wall 45, and the organic layer 40 is formed on the inner side of the first dam wall 45.

Then, the second inorganic layer 41 is formed by forming an inorganic insulating film such as silicon oxide (SiOx), silicon nitride (SiNx), silicon oxynitride (SiOxNy; x>y), or silicon nitride oxide (SiNxOy; x>y) as a single layer or a laminated layer on the mother substrate 60 having the organic layer 40 formed thereon using a film forming mask which is a CMM, for example, by a CVD method.

In this manner, in the sealing film forming step S03, the sealing film 10 in which the first inorganic layer 39, the organic layer 40, and the second inorganic layer 41 are layered is formed.

Flexibilization Step

In the flexibilization step S04, a glass substrate is peeled off from the bottom surface of the mother substrate by attaching a protection sheet (not illustrated) to the surface of the mother substrate 60 having the sealing film 10 formed thereon and then irradiating the bottom surface of the mother substrate 60 with a laser beam from the glass substrate side, and a protection sheet (not illustrated) is attached to the bottom surface of the mother substrate 60 from which the glass substrate has been peeled off.

Division Step

In the division step S05, the mother substrate 60 from which the glass substrate has been peeled off is divided in units of display panels by irradiation with a laser beam. At this time, a division line DL at the time of dividing the mother substrate 60 is a boundary between each of the panel constituent regions 61 and the outer region thereof and is a location corresponding to the outer edge of each of the panel constituent regions 61 (see FIG. 9). A plurality of the display panels 2 are obtained by dividing the mother substrate 60 in this manner.

Mounting Step

In the mounting step S06, the connection of an FPC to the terminal portion T, and the like are performed on the display panel 2 obtained by dividing the mother substrate 60.

The organic EL display device 1 can be manufactured as described above.

According to the organic EL display device 1 of the first embodiment, the protruding portion 50 facing the rounded corner portions Da and the notch portion Db in the display region D are provided higher than the first dam wall 45 and the second dam wall 46 on the outer side of the second dam wall 46 in the frame region F. Thus, in the manufacture of the organic EL display device 1, even when the film forming mask 70 provided with the shielding portion 77 for forming the rounded corner portions Da and the notch portion Db in the display region D is used, the mask sheet 72 comes into contact with the protruding portion 50 in preference to the second dam wall 46 in a region where the shielding portion 77 of the film forming mask 70 is provided. Thereby, the mask sheet 72 of the film forming mask 70 is prevented from coming into contact with the first dam wall 45 and the second dam wall 46, and thus it is possible to inhibit the generation of foreign substances at the corresponding locations of both the dam walls 45 and 46 and on the display region D side thereof. As a result, it is possible to prevent a reduction in the quality of display of the organic EL display device 1 caused by foreign substances generated from the first dam wall 45 and the second dam wall 46.

Modification Example of First Embodiment

Figure 13:
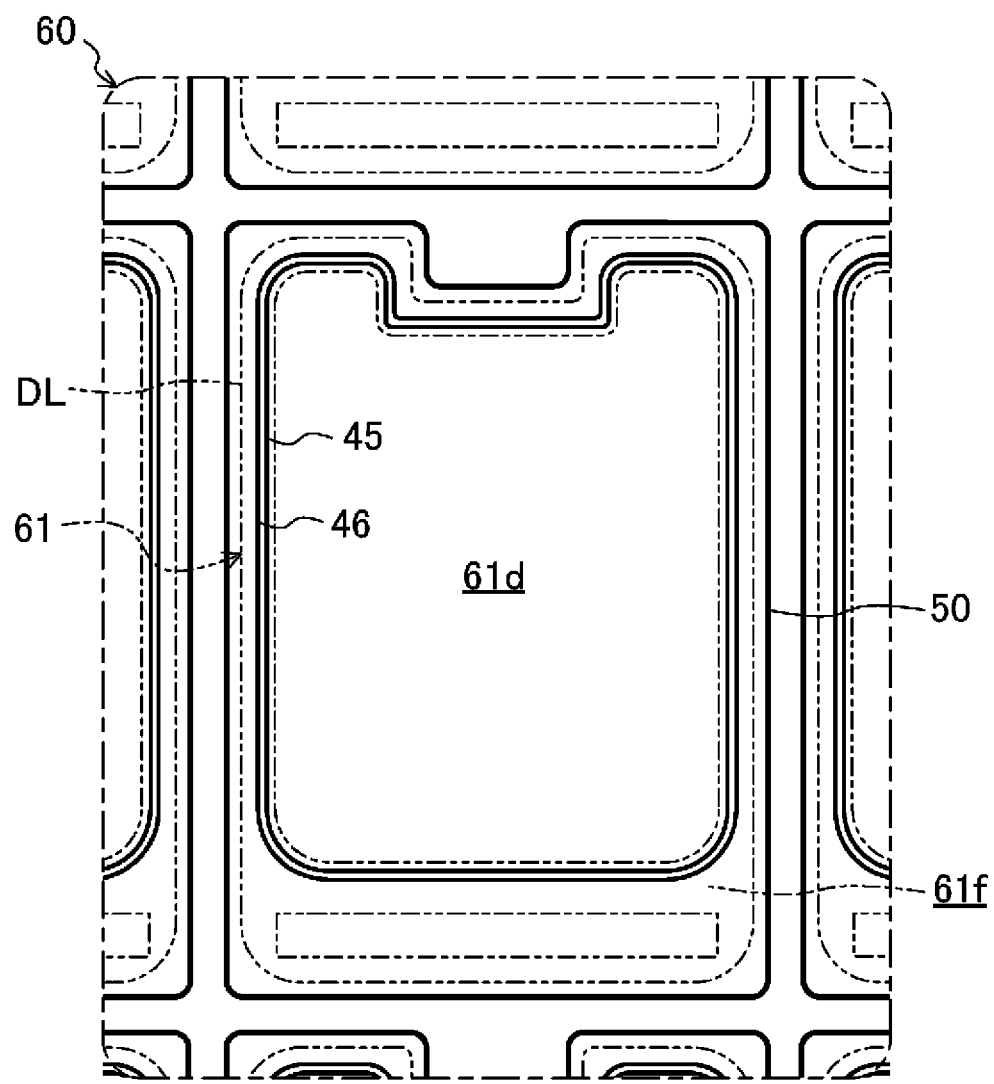
FIG. 13 is a plan view illustrating a configuration of main parts of one panel constituent region of a mother substrate in a manufacturing process for an organic EL display device according to a modification example of the first embodiment.

FIG. 13 is a plan view illustrating a configuration of main parts of one panel constituent region 61 of the mother substrate 60 in the manufacturing process for the organic EL display device 1 according to the present modification example.

In a method of manufacturing the organic EL display device 1 according to the first embodiment, the protruding portion 50 is formed on the inner side of the panel constituent region 61 in the mother substrate 60, that is, on the inner side of the division line DL. However, in a method of manufacturing the organic EL display device 1 according to the present modification example, the protruding portion 50 is formed on the outer side of the panel constituent regions 61 in the mother substrate 60, that is, on the outer side of the division line DL, as illustrated in FIG. 13.

The protruding portion 50 is provided in a frame shape throughout the entire outer periphery of the panel constituent regions 61 in the mother substrate 60. The outer periphery of the panel constituent regions 61 in the mother substrate 60 is a portion which is an end material in the division step S05, and components related to the display panel 2 such as the lead wiring lines 15f are not provided at all. In the organic EL display device 1 manufactured by such a manufacturing method, the protruding portion 50 is not left in a product because it is separated from the display panel 2 in the division step S05.

Incidentally, when the mask sheet 72 of the film forming mask 70 comes into contact with the first dam wall 45 and the second dam wall 46 in the organic EL layer forming step S23 in the manufacture of the organic EL display device 1, the dam wall in contact with the mask sheet 72 may be damaged. In this case, the first dam wall 45 and the second dam wall 46 intersect the lead wiring lines 15f, and thus there is a concern that moisture or the like infiltrates into the display region D by passing through the lead wiring lines 15f from the damaged portions of the dam walls 45 and 46. Specifically, in a case where an overhang shape or the like is formed in a side end portion of the lead wiring line 15f, the first inorganic layer 39 of the sealing film 10 formed on the lead wiring line 15f cannot completely cover the side end portion of the lead wiring line 15f, and thus there is a concern that a small gap may be generated in the side end portion. Moisture infiltrating into the dam walls 45 and 46 from the damaged portions of the dam walls 45 and 46 may infiltrate into a display region through the gap generated in the side end portion of the lead wiring line 15f when the moisture reaches intersection portions between the dam walls 45 and 46 and the lead wiring line 15f.

According to the method of manufacturing the organic EL display device 1 according to the present modification example, the same effects as those in the first embodiment can be obtained, and the protruding portion 50 is formed on the outer side of the division line DL in which the lead wiring lines 15f and the like in the mother substrate 60 are not formed. Thus, even when the protruding portion 50 is damaged when coming into contact with the mask sheet 72 of the film forming mask 70 in a region in which the shielding portion 77 is provided in the organic EL layer forming step S23, the protruding portion 50 does not intersect the lead wiring lines 15f, and thus there is no concern that moisture or the like will infiltrate into the display region D through the damaged portion of the protruding portion 50.

Second Embodiment

Figure 14:
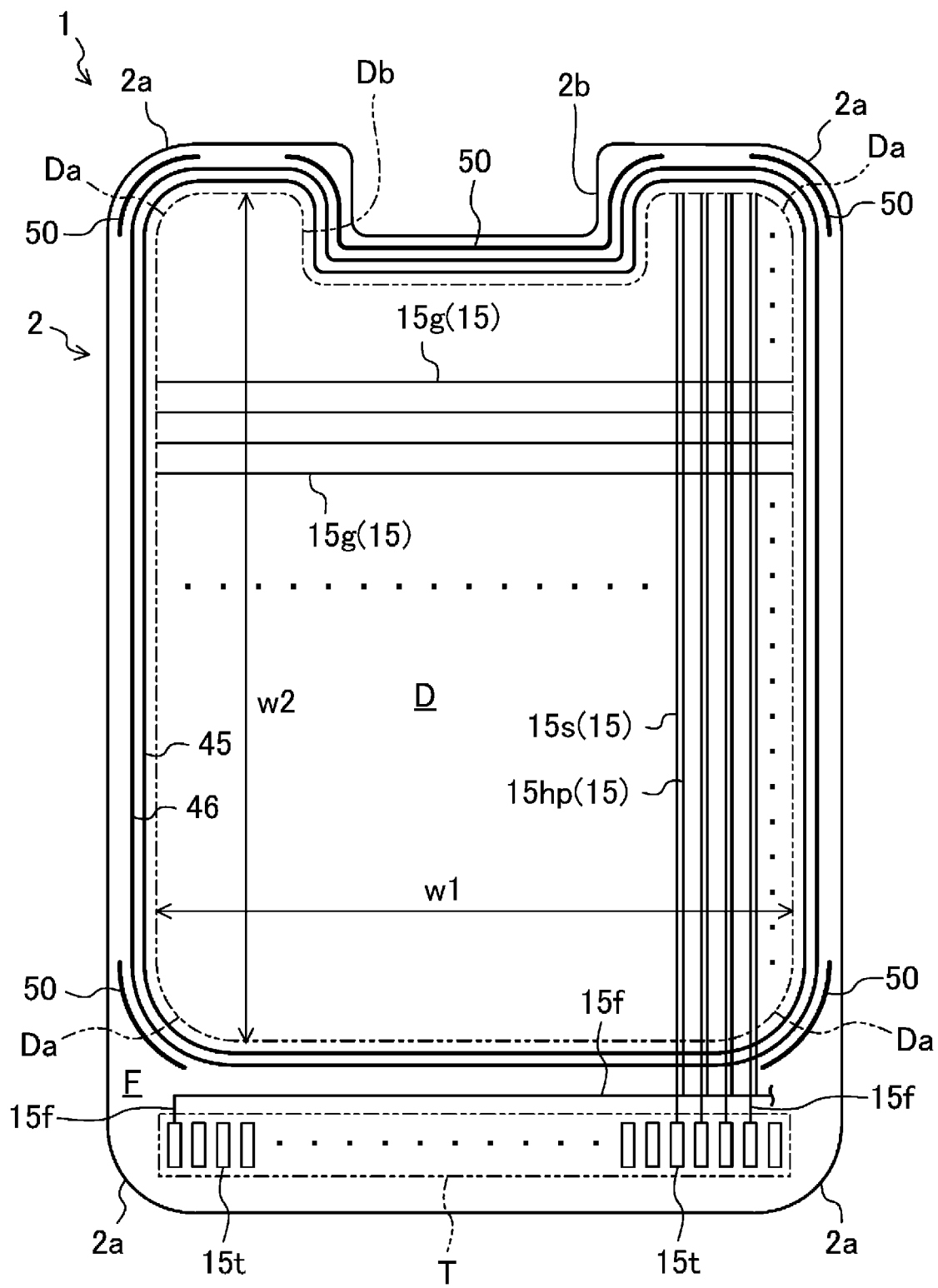
FIG. 14 is a plan view illustrating a schematic configuration of a display panel constituting an organic EL display device according to a second embodiment.

FIG. 14 is a plan view illustrating a schematic configuration of the display panel 2 constituting the organic EL display device 1 according to a second embodiment.

In the organic EL display device 1 according to the first embodiment, the protruding portion 50 is provided in a frame shape throughout the entire periphery on the outer side of the second dam wall 46 in the frame region F. However, in the organic EL display device 1 according to the second embodiment, the protruding portion 50 is provided in an island shape at each of positions facing the rounded corner portions Da and the notch portion Db in the display region D on the outer side of the second dam wall 46 in the frame region F, as illustrated in FIG. 14. The plurality of protruding portions 50 are separated from each other and do not intersect lead wiring lines 15*f* even in the frame region F.

According to the organic EL display device 1 of the second embodiment, the same effects as those in the first embodiment can be obtained. In addition, similar to the modification example of the first embodiment, even when the protruding portion 50 is damaged when coming into contact with the mask sheet 72 of the film forming mask 70 in a region in which the shielding portion 77 is provided in the organic EL layer forming step S23, the protruding portion 50 does not intersect the lead wiring line 15*f*, and thus there is no concern that moisture or the like will infiltrate into the display region D through the damaged portion of the protruding portion 50.

Modification Example of Second Embodiment

Figure 15:
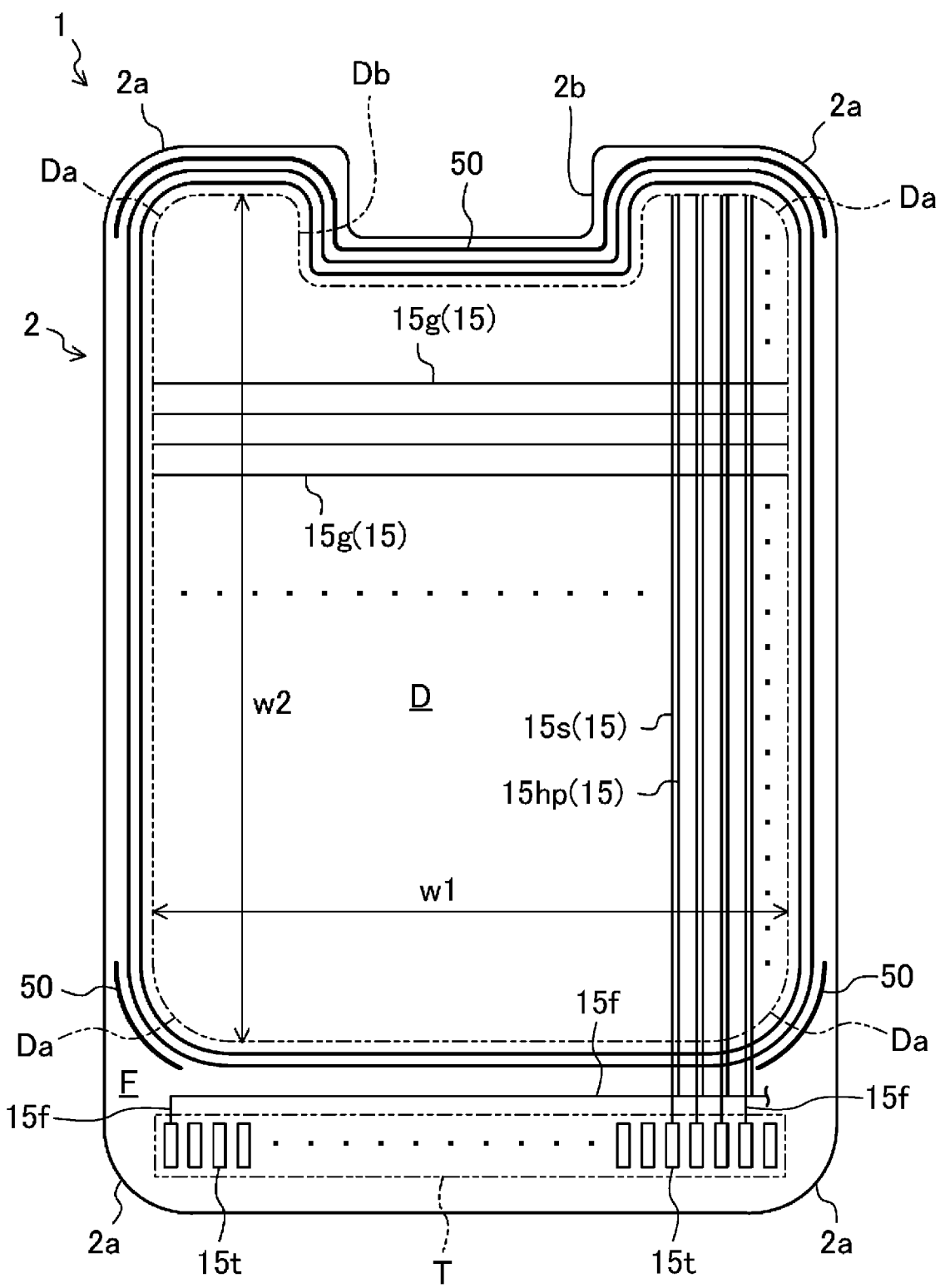
FIG. 15 is a plan view illustrating a schematic configuration of a display panel constituting an organic EL display device according to a modification example of the second embodiment.

FIG. 15 is a plan view illustrating a schematic configuration of the display panel 2 constituting the organic EL display device 1 according to the present modification example.

In the organic EL display device 1 according to the second embodiment, the protruding portions 50 are provided in island shapes separated from each other at positions facing the rounded corner portions Da and the notch portion Db on the outer side of the second dam wall 46 in the frame region F, but the protruding portions 50 adjacent to each other among the plurality of protruding portions 50 may be continuously provided. For example, as illustrated in FIG. 15, the protruding portions 50 may be provided to be separated in island shapes at locations facing two rounded corner portions Da on the terminal portion T side in the display region D, and may be provided continuously at locations facing the notch portion Db and both the two rounded corner portions Da positioned on both sides of the notch portion Db in the display region D.

Third Embodiment

Figure 16:
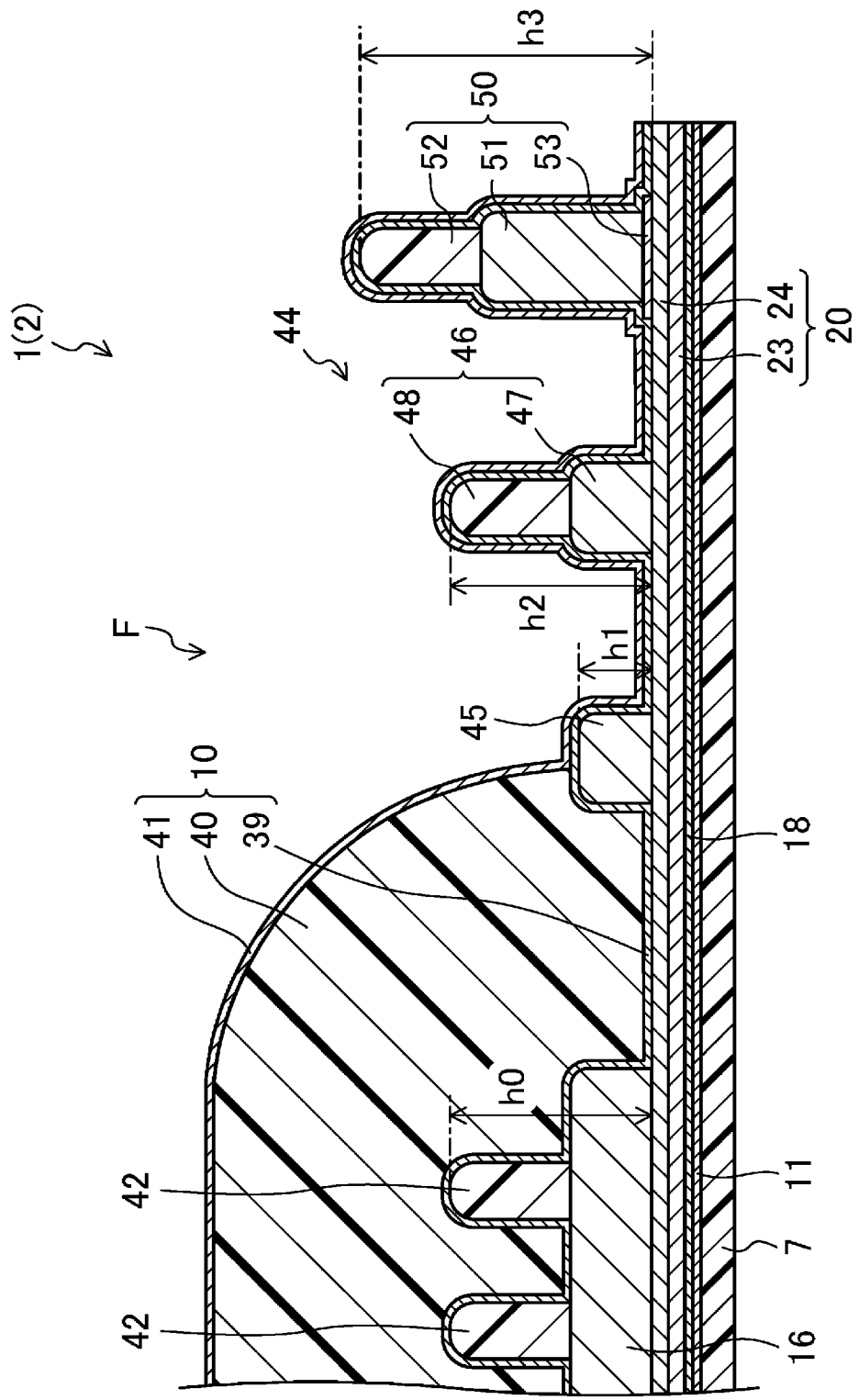
FIG. 16 is a diagram corresponding to FIG. 6 and illustrating a display panel constituting an organic EL display device according to a third embodiment.

FIG. 16 is a diagram corresponding to FIG. 6 and illustrating the display panel 2 constituting the organic EL display device 1 according to a third embodiment.

In the organic EL display device 1 according to the first embodiment, the protruding portion 50 is configured such that the first convex layer 51 formed of the same material in the same layer as the flattening film 16 and the second convex layer 52 formed of the same material in the same layer as the edge cover 33 are layered. However, in the organic EL display device 1 according to the third embodiment, the protruding portion 50 includes a third convex layer 53 provided on a lower layer of a first convex layer 51 in addition to the first convex layer 51 and the second convex layer 52, as illustrated in FIG. 16.

The third convex layer 53 is formed of the same material in the same layer as the gate electrode 19 or the source electrode 21. In a case where the third convex layer 53 is formed of the same material in the same layer as the gate electrode 19, the third convex layer 53 may be formed together with the gate wiring line 15*g* and the like from a layered conductive film forming the gate electrode 19 in the gate electrode forming step S14 in a method of manufacturing the organic EL display device 1. Further, in a case where the third convex layer 53 is formed of the same material in the same layer as the source electrode 21, the third convex layer 53 may be formed together with the source wiring line 15*s* and the like from a layered conductive film forming the source electrode 21 and the drain electrode 22 in the source drain electrode forming step S16 in the method of manufacturing the organic EL display device 1.

According to the organic EL display device 1 of the third embodiment, the protruding portion 50 has a structure in which the first convex layer 51, the second convex layer 52, and the third convex layer 53 are layered, and thus the height h3 of the protruding portion 50 becomes larger than the heights h1 and h2 of the first dam wall 45 and the second dam wall by the amount of the third convex layer 53 provided. Accordingly, in the manufacture of the organic EL display device 1, even when the mask sheet 72 of the film forming mask 70 used in the organic EL layer forming step S23 is displaced due to being pressed against the mother substrate 60 side in a region where the shielding portion 77 is provided, it is possible to reliably bring the mask sheet 72 into contact with the protruding portion 50 and preferably prevent the shielding portion 77 from coming into contact with the second dam wall 46.

Other Embodiments

In the first embodiment, the height h3 of the protruding portion 50 is larger than the height h2 of the second dam wall 46, but this is not limiting. The height h3 of the protruding portion 50 may be the same as the height of the second dam wall 46. In short, it is only required that the height h3 of the protruding portion is equal to or greater than the height h2 of the second dam wall 46.

The cover sheet 73 and the supporting sheet 74 strongly press the mask sheet 72 toward the mother substrate 60 when the sheets are drawn to the mother substrate 60 side due to a magnetic force. However, the cover sheet 73 and the supporting sheet 74 are disposed on a side closer to the protruding portion 50 than a second dam wall 46, and thus the protruding portion 50 comes into contact with the mask sheet 72 before coming into contact with the second dam wall 46. In a case where the height h3 of the protruding portion 50 and the height h2 of the second dam wall 46 are the same, the mask sheet 72 may be pressed against the second dam wall 46. However, at this time, the mask sheet 72 has already come into contact with the protruding portion 50, and thus a pressing force of the mask sheet 72 is distributed by the protruding portion 50. Thus, even when foreign substances are generated in a contact portion between the mother substrate 60 and the mask sheet 72 in association with the pressing of the mask sheet 72, foreign substances are generated preferentially in the protruding portion 50. Thus, also in this case, it is possible to inhibit the generation of foreign substances at the corresponding locations of the first dam wall 45 and the second dam wall 46 and on the display region D side thereof.

As described above, the preferred embodiments and the modification examples thereof have been described as examples of the technique of the present disclosure. However, the technique of the present disclosure is not limited thereto and is also applicable to an embodiment in which modification, replacement, addition, omission, and the like are made appropriately. In addition, the components described in the embodiments and modification examples described above can be combined into a new embodiment. Further, the components described in the accompanying drawings and detailed description may also include components that are not essential for the purpose of solving the problems. For this reason, those components that are not essential should not be recognized as essential immediately as described in the accompanying drawings and detailed description.

For example, in the first embodiment, the first dam wall 45 is formed of the same material in the same layer as the flattening film 16, but the scope of application of the present disclosure is not limited thereto. The first dam wall 45 may be formed of the same material in the same layer as the edge cover 33 (that is, the first dam wall 45 may be composed of only a single layer corresponding to the second wall layer 48 of the second dam wall 46), or may have a structure in which the first wall layer 47 and the second wall layer 48 similar to the second dam wall 46 are layered.

Further, in the first embodiment, the protruding portion 50 is configured such that the first convex layer 51 formed of the same material in the same layer as the flattening film 16 and the second convex layer 52 formed of the same material in the same layer as the edge cover 33 are layered. In the third embodiment, the protruding portion 50 includes the third convex layer 53 formed of the same material in the same layer as the gate electrode 19 or the source electrode 21, in addition to the first convex layer 51 and the second convex layer 52, but the scope of application of the technique of the present disclosure is not limited thereto. For example, in a case where the photospacer 42 is formed as a layer separate from the edge cover 33, the protruding portion 50 may include a fourth convex layer formed of the same material in the same layer as the photospacer 42. Furthermore, the first dam wall 45 and the second dam wall 46 may also include a layer equivalent to the fourth convex layer on the assumption that the first dam wall 45 and the second dam wall 46 are not higher than the protruding portion 50. In short, it is only required that the protruding portion 50 is provided to be higher than the dam walls 45 and 46 constituting the dam structure 44. The protruding portion 50 and the dam walls 45 and 46 may be a single-layered structure or a layered structure, and various structures may be adopted.

Additionally, in the first embodiment described above, the organic EL layer 30 is formed in each of the subpixels 6. However, the scope of application of the technique of the present disclosure is not limited thereto. The organic EL layer 30 may be provided and shared by the plurality of subpixels 6. In this case, the organic EL display device 1 may include, for example, a color filter to perform color tone expression of the subpixels 6.

Additionally, in the first embodiment described above, the organic EL display device 1 using the resin substrate layer 7 as a substrate has been described as an example, but the scope of application of the technique of the present disclosure is not limited thereto. As the substrate, a substrate formed of an inorganic material such as glass and quartz, plastic such as polyethylene terephthalate, and ceramic such as alumina may be used. Additionally, the substrate may be a substrate being a metal substrate, such as aluminum and iron, having one surface coated with silica gel, an organic insulating material, or the like; or a substrate being a metal substrate having a surface subjected to insulation treatment by a method such as anode oxidation.

Further, in the first embodiment described above, a top gate type structure is adopted for the first TFTs 12 and the second TFTs 13, but the scope of application of the technique of the present disclosure is not limited thereto. The first TFTs 12 and the second TFTs 13 may adopt a bottom gate type structure.

Additionally, in the first embodiment described above, the organic EL display device 1 in which the first electrode 29 is an anode and the second electrode 31 is a cathode has been described as an example. However, the scope of application of the technique of the present disclosure is not limited thereto. The technique of the present disclosure is also applicable to, for example, the organic EL display device 1 in which the organic EL layer 30 has a reversed layered structure in which the first electrode 29 is a cathode and the second electrode 31 is an anode.

Additionally, in the first embodiment described above, the organic EL layer 30 including a five-layered structure including the hole injection layer 34, the hole transport layer 35, the light-emitting layer 36, the electron transport layer 37, and the electron injection layer 38 has been described as an example, but the scope of application of the technique of the present disclosure is not limited thereto. For example, the organic EL layer 30 may adopt a three-layered structure including a hole injection-cum-transport layer, a light-emitting layer, and an electron transport-cum-injection layer, and can adopt any structure.

Further, in the first to third embodiments described above, the organic EL display device 1 has been described as an example of a display device, but the scope of application of the technique of the present disclosure is not limited thereto. The technique of the present disclosure is applicable to a display device including a plurality of current-driven light-emitting elements, for example, a display device including a quantum dot light emitting diode (QLED) that is a light-emitting element using a quantum dot-containing layer.

INDUSTRIAL APPLICABILITY

As described above, the technique of the present disclosure is useful for a display device that includes a display region having a variant shape.

REFERENCE SIGNS LIST

D Display region
Da Rounded corner portion (variant portion) in display region
Db: Notch portion (variant portion) in display region
F Frame region
T Terminal portion
h0 Height of photospacer
h1 Height of first dam wall
h2 Height of second dam wall
h3 Height of protruding portion
1 Organic EL display device
2 Display panel
2a Rounded corner portion of display panel
2b Notch portion of display panel
5 Pixel
6 Subpixel
6r Red subpixel
6g Green subpixel
6b Blue subpixel
7 Resin substrate layer (base substrate)
8 TFT layer
9 Organic EL element
10 Sealing film
11 Base coat film
12 First TFT
13 Second TFT
14 Capacitor
15 Display wiring line
15g Gate wiring line
15s Source wiring line
15hp High voltage power source wiring line
16 Flattening film
17 Semiconductor layer 18 Gate insulating film
19 Gate electrode
20 Interlayer insulating film
21 Source electrode
22 Drain electrode
23 First interlayer insulating film
24 Second interlayer insulating film
25 Contact hole
26 Lower conductive layer
27 Upper conductive layer
28 Contact hole
29 First electrode (pixel electrode)
30 Organic EL layer
31 Second electrode
32 Contact hole
33 Edge cover
34 Hole injection layer
35 Hole transport layer
36 Light-emitting layer
37 Electron transport layer
38 Electron injection layer
39 First inorganic layer
40 Organic layer
41 Second inorganic layer
42 Photospacer
44 Dam structure
45 First dam wall
46 Second dam wall
47 First wall layer
48 Second wall layer
50 Protruding portion
51 First convex layer
52 Second convex layer
60 Mother substrate
61 Panel constituent region
61*d* Portion constituting display region
61*f* Portion constituting frame region
70 Film forming mask
71 Mask frame
72 Mask sheet
73 Cover sheet
74 Support sheet (supporting member)
75 Vapor deposition pattern opening
76 Through-hole
77 Shielding portion
78 First shielding portion
79 Second shielding portion
80 Vacuum vapor deposition device
81 Film formation chamber
82 Substrate holder
84 Magnetic force portion
85 Vapor deposition source
86 Exhaust port
87 Gate valve

The invention claimed is:

1. A display device comprising:
a base substrate;
a thin-film transistor (TFT) layer provided on the base substrate;
a light-emitting element provided on the TFT layer;
a sealing film provided to cover the light-emitting element,
a display region for displaying an image by light emission of the light-emitting element; and
a frame region positioned around the display region, wherein,
the frame region is provided with a dam wall surrounding the display region, and the sealing film includes an organic layer provided on an inner side of the dam wall,
the display region is provided in a variant shape including a variant portion, an outer peripheral shape of the variant portion being different from a rectangular shape,
a protruding portion having a height equal to or greater than a height of the dam wall is provided at a position facing the variant portion in the display region through the dam wall on an outer side of the dam wall in the frame region,
the frame region is provided with a lead wiring line electrically connected to a wiring line in the display region,
the dam wall intersects the lead wiring line, and
the protruding portion does not intersect the lead wiring line.

2. The display device according to claim 1, wherein the protruding portion is higher than the dam wall.

3. The display device according to claim 1, wherein
the dam wall includes a first dam wall portion provided on the display region side and overlapping a peripheral end portion of the organic layer and a second dam wall portion provided to surround the first dam wall portion, and
the second dam wall portion is higher than the first dam wall portion.

4. The display device according to claim 1, wherein the protruding portion is formed in an island shape with respect to the variant portion.

5. The display device according to claim 1, wherein the protruding portion is formed in a shape conforming to an outer edge of the variant portion.

6. The display device according to claim 1, wherein
the frame region is provided in a frame shape having a plurality of sides,
a terminal portion is provided on one side of the frame region, and
the lead wiring line intersects the dam wall at one side of the frame region where the terminal portion is provided.

7. The display device according to claim 1, wherein
the light-emitting element includes a plurality of pixel electrodes provided for each pixel constituting the display region, and an edge cover provided to cover peripheral end portions of the pixel electrodes, and
at least a portion of the protruding portion is formed of an identical material in an identical layer as the edge cover.

8. The display device according to claim 7, wherein at least a portion of the dam wall is formed of an identical material in an identical layer as the edge cover.

9. The display device according to claim 1, wherein
the display region is provided in a shape in which the variant portion is provided at four corners of a rectangular shape, and
the protruding portion is provided for each of the four corners that are the variant portions in the display region.

10. The display device comprising:
a base substrate;
a thin-film transistor (TFT) layer provided on the base substrate;
a light-emitting element provided on the TFT layer;
a sealing film provided to cover the light-emitting element;

a display region for displaying an image by light emission of the light-emitting element; and a frame region positioned around the display region, wherein the frame region is provided with a dam wall surrounding the display region, and the sealing film includes an organic layer provided on an inner side of the dam wall, the display region is provided in a variant shape including a variant portion, an outer peripheral shape of the variant portion being different from a rectangular shape, a protruding portion having a height equal to or greater than a height of the dam wall is provided at a position facing the variant portion in the display region through the dam wall on an outer side of the dam wall in the frame region, the frame region is provided in a frame shape having a plurality of sides, a terminal portion is provided at one side of the frame region, an intermediate portion on one side positioned on a side opposite to the terminal portion in the display region constitutes a notch portion as the variant portion provided in a bent recessed shape on an inner side of the display region when seen in a plan view, and a contour of corner portions equivalent to two end portions of the one side constitutes a rounded corner portion as the variant portion provided in a curved shape, and the protruding portion is provided continuously at locations facing both the notch portion and the rounded corner portion.

11. The display device according to claim 10, wherein the protruding portion is higher than the dam wall.

12. The display device according to claim 10, wherein the dam wall includes a first dam wall portion provided on a display region side and overlapping a peripheral end portion of the organic layer and a second dam wall portion provided to surround the first dam wall portion, and the second dam wall portion is higher that the first dam wall portion.

13. The display device according to claim 10, wherein the protruding portion is formed in an island shape with respect to the variant portion.

14. The display device according to claim 10, wherein the protruding portion is formed in a shape conforming to an outer edge of the variant portion.

15. A method of manufacturing a display device, the method comprising:

a thin-film transistor (TFT) layer forming step of forming a TFT layer on a base substrate;

a light-emitting element forming step of forming a light-emitting element on the TFT layer;

a sealing film forming step of forming a sealing film including an organic layer to cover the light-emitting element;

a division step of forming the TFT layer, the light-emitting element, and the sealing film in each of a plurality of panel constituent regions of a mother substrate using the mother substrate including the panel constituent regions constituting a display panel as the base substrate, and dividing the mother substrate in units of the display panels after the sealing film forming step, wherein a dam wall surrounding a display region is formed in a frame region positioned around the display region for displaying an image by light emission of the light-emitting element before the sealing film forming step, spreading of an organic resin material forming the organic layer outside the frame region is dammed back by the dam wall in the sealing film forming step, the display region is provided in a variant shape including a variant portion, an outer peripheral shape of the variant portion being different from a rectangular shape, a protruding portion having a height equal to or greater than a height of the dam wall is formed at a position facing the variant portion in the display region through the dam wall on an outer side of the dam wall in the frame region after the TFT layer forming step, and the protruding portion is formed on an outer side of a division line dividing the protruding portion in units of the display panels of the mother substrate in the division step.

16. The method of manufacturing a display device according to claim 15, wherein the protruding portion is formed in an island shape with respect to the variant portion.

17. The method of manufacturing a display device according to claim 15, wherein the protruding portion is formed in a shape conforming to an outer edge of the variant portion.

18. The method of manufacturing a display device according to claim 15, wherein a film forming mask is used to form the light-emitting element in the light-emitting element forming step, the film forming mask includes a mask frame, a plurality of mask sheets stretched from one side of the mask frame to an opposing side and having through-holes for film formation formed therein, and a plurality of supporting members that support the plurality of mask sheets, a supporting member of the plurality of supporting members is provided with a shielding portion for partially shielding the through-holes to form the variant portion in the display region, and the protruding portion is formed at a position facing the shielding portion of the supporting member when film formation is performed using the film forming mask.

19. The method of manufacturing a display device according to claim 15, wherein the dam wall and the protruding portion are simultaneously formed using a gray tone mask.

20. The method of manufacturing a display device according to claim 19, wherein pixel electrodes are formed for each pixel constituting the display region in the light-emitting element forming step, and an edge cover that covers peripheral end portions of the pixel electrodes is formed simultaneously with the dam wall and the protruding portion.

* * * * *